US012809071B2

(12) United States Patent
Ishikawa et al.

(10) Patent No.: US 12,809,071 B2
(45) Date of Patent: Nov. 24, 2026

(54) OPTICAL FILM AND DISPLAY DEVICE

(71) Applicant: TOPPAN INC., Tokyo (JP)

(72) Inventors: Shinya Ishikawa, Tokyo (JP); Yoshiko Ishimaru, Tokyo (JP); Kai Futamata, Tokyo (JP)

(73) Assignee: TOPPAN INC., Tokyo (JP)

( * ) Notice: Subject to any disclaimer, the term of this patent is extended or adjusted under 35 U.S.C. 154(b) by 462 days.

(21) Appl. No.: 18/244,897

(22) Filed: Sep. 11, 2023

(65) Prior Publication Data

US 2023/0422568 A1 Dec. 28, 2023

Related U.S. Application Data

(63) Continuation of application No. PCT/JP2022/010832, filed on Mar. 11, 2022.

(30) Foreign Application Priority Data

Mar. 12, 2021 (JP) ................................ 2021-040749

(51) Int. Cl.
*G02B 5/22* (2006.01)
*G02B 1/12* (2006.01)
(Continued)

(52) U.S. Cl.
CPC ............... *G02B 5/223* (2013.01); *G02B 1/12* (2013.01); *G02B 1/16* (2015.01); *G02B 1/18* (2015.01);
(Continued)

(58) Field of Classification Search
CPC . G02B 5/223; G02B 1/16; G02B 1/18; G02B 1/12; H10K 59/1201; H10K 59/32;
(Continued)

(56) References Cited

U.S. PATENT DOCUMENTS 6,203,951 B1 3/2001 Furukawa et al.
9,112,179 B2 8/2015 Park et al.
(Continued)

FOREIGN PATENT DOCUMENTS

JP 2001-147319 A 5/2001
JP 2001-166131 A 6/2001
(Continued)

OTHER PUBLICATIONS

Office Action issued in corresponding Taiwanese Patent Application No. 111108953 dated Aug. 26, 2025.
(Continued)

*Primary Examiner* — Nathanael R Briggs
(74) *Attorney, Agent, or Firm* — Foley & Lardner LLP

(57) ABSTRACT

An optical film includes a transparent substrate, a colored layer including one or more layers that contain a first colorant material with a maximum absorption wavelength of 470 nm or more and 530 nm or less and a half width of an absorption spectrum of 15 nm or more and 45 nm or less, a second colorant material with a maximum absorption wavelength of 560 nm or more and 620 nm or less and a half width of an absorption spectrum of 15 nm or more and 55 nm or less, and a third colorant material with a wavelength range of 400 nm to 780 nm, a wavelength with a transmittance in a range of 650 nm or more and 780 nm or less, and one or more functional layers facing a surface of the colored layer opposite the transparent substrate, with an ultraviolet absorption layer.

13 Claims, 3 Drawing Sheets

(51) Int. Cl.

| | |
|---|---|
| ***G02B 1/16*** | (2015.01) |
| ***G02B 1/18*** | (2015.01) |
| ***H10K 50/86*** | (2023.01) |
| ***H10K 59/12*** | (2023.01) |
| ***H10K 59/32*** | (2023.01) |
| ***H10K 59/38*** | (2023.01) |
| ***H10K 59/80*** | (2023.01) |
| ***H10K 102/00*** | (2023.01) |

(52) U.S. Cl.
CPC ......... *H10K 59/1201* (2023.02); *H10K 59/32* (2023.02); *H10K 59/38* (2023.02); *H10K 50/865* (2023.02); *H10K 59/8791* (2023.02); *H10K 2102/302* (2023.02)

(58) Field of Classification Search
CPC ............... H10K 59/38; H10K 59/8791; H10K 2102/302; H10K 50/865
See application file for complete search history.

(56) References Cited

U.S. PATENT DOCUMENTS

| | | | |
|---|---|---|---|
| 2009/0058250 A1 | 3/2009 | Sin et al. | |
| 2010/0103355 A1 | 4/2010 | Sakamoto et al. | |
| 2019/0258098 A1 | 8/2019 | Oba et al. | |
| 2020/0217999 A1 | 7/2020 | Miyata et al. | |
| 2022/0109128 A1 | 4/2022 | Fukagawa et al. | |
| 2023/0244140 A1* | 8/2023 | Kim ........................ | G03F 7/105 430/288.1 |

FOREIGN PATENT DOCUMENTS

| | | | |
|---|---|---|---|
| JP | 2002-071940 A | | 3/2002 |
| JP | 2005-070724 A | | 3/2005 |
| JP | 2006-201376 A | | 8/2006 |
| JP | 2007-096218 A | | 4/2007 |
| JP | 2008-083682 A | | 4/2008 |
| JP | 2008-102340 A | | 5/2008 |
| JP | 2009-031733 A | | 2/2009 |
| JP | 2011-141356 A | | 7/2011 |
| JP | 2012-118305 A | | 6/2012 |
| JP | 5673713 B2 | | 2/2015 |
| JP | 2017-161755 A | | 9/2017 |
| JP | 2018-136361 A | | 8/2018 |
| KR | 2002071940 A | * | 3/2002 |
| KR | 20190109988 A | * | 9/2019 |
| WO | WO-2014/155787 A1 | | 10/2014 |
| WO | WO-2018/084289 A1 | | 5/2018 |
| WO | WO-2019/065021 A1 | | 4/2019 |
| WO | WO-2021/014973 A1 | | 1/2021 |

OTHER PUBLICATIONS

International Searching Authority, "International Search Report," issued in connection with International Patent Application No. PCT/JP2022/010832, dated May 24, 2022.
International Searching Authority, "Written Opinion," issued in connection with International Patent Application No. PCT/JP2022/010832, dated May 24, 2022.
European Extended Search Report issued in corresponding European Patent Application No. 22767265.6 dated Jul. 17, 2024 (11 pages).
Office Action issued in corresponding Japanese Patent Application No. 2021-040749 dated Dec. 21, 2021 (8 pages).

* cited by examiner

OPTICAL FILM AND DISPLAY DEVICE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/010832, filed on Mar. 11, 2022, which is based upon and claims the benefit of priority to Japanese Patent Application No. 2021-040749, filed on Mar. 12, 2021, the disclosures of which are incorporated herein by reference in their entirety.

TECHNICAL FIELD

The present invention relates to an optical film and a display device.

BACKGROUND

Self-luminous display devices that include self-luminescent elements such as organic light emitting devices are, unlike liquid crystal display devices and the like, easy to miniaturize and have good characteristics such as low power consumption, high luminance, and high response speed, and thus have potential as next-generation display devices. Electrodes and wires made of metal are provided in a region of the display surface of a self-luminous display device. Thus, light incident on the display screen from the outside (i.e., external light) is reflected by the electrodes or the wires, easily leading to lower display quality such as lower contrast.

In order to solve the above problem, for example, a configuration has been proposed in which a polarizing plate and a phase retardation plate are provided on the surface of a self-luminous display device. However, in the configuration using a polarizing plate and a phase retardation plate, when light emerging from the display device passes through the polarizing plate and the phase retardation plate to the outside, most of the light is lost, easily leading to a shorter life of the elements.

Furthermore, display devices are required to have high color purity. Color purity indicates the range of colors that can be displayed by a display device, and is also referred to as a color reproduction range. Thus, high color purity means a large color reproduction range and high color reproducibility. Known methods of achieving higher color reproducibility include a technique in which a light source that emits white light is subjected to color separation using a color filter, and a technique in which a light source that emits monochromatic light in the three primary colors R, G, and B is subjected to correction for a narrow half-value width using a color filter. In order to achieve higher color reproducibility of a display device using a color filter, a color filter having a greater thickness and a higher concentration of colorant material are required, thus leading to lower display quality such as a poor pixel shape or poor viewing angle characteristics. For a display device including a light source that emits monochromatic light in the three primary colors R, G, and B, a process of forming a color filter is required, thus leading to higher cost.

As a display device having a configuration different from the configuration using a polarizing plate and a phase retardation plate or the configuration using a color filter described above, for example, Patent Literature 1 discloses an organic light emitting display device that includes a display substrate including an organic light emitting element, and a sealing substrate provided apart from the display substrate and in which a space between the display substrate and the sealing substrate is filled with a filler that selectively absorbs external light for each wavelength range to adjust the transmittance. In this configuration, reflection of external light is reduced to provide better visibility, and of light emerging from the display device, in particular, light in the wavelength range that leads to lower color purity is selectively absorbed to achieve higher color purity. However, the disclosed technique is insufficient to reduce reflection of external light, and causes coloration of reflected light. Furthermore, colorant materials that absorb light having specific wavelengths have insufficient reliability in terms of light resistance or the like, and are thus difficult to be put into practical use.

CITATION LIST

Patent Literature

[PTL 1] JP 5673713 B.

SUMMARY OF THE INVENTION

Technical Problem

The conventional technique as described above has the following problems.

In a device using a polarizing plate and a phase retardation plate, the amount of external light that is reflected can be reduced, but the amount of display light generated by an organic light emitting element is also reduced.

Furthermore, Patent Literature 1 proposes, as the filler having wavelength selective absorption properties disclosed in Patent Literature 1, a configuration containing a colorant having the maximum absorption wavelength in the wavelength region of 480 nm to 510 nm and a colorant having the maximum absorption wavelength in the wavelength region of 580 nm to 610 nm. Thus, it is difficult to remove the influence of external light in the wavelength range of less than 480 nm and the wavelength range of more than 610 nm. Failure in reducing external light in such a wavelength range leads to an insufficient reflectance reduction effect and deterioration in reflection hue. Furthermore, colorants having wavelength selective absorption properties as described above have insufficient reliability in terms of light resistance or the like, and are thus difficult to be put into practical use unless the reliability of the colorants is improved.

In view of the above circumstances, the present invention provides an optical film achieving higher display quality and a longer life of a light emitting element, and a display device including the optical film.

Solution to Problem

In order to solve the above problem, an optical film of a first aspect of the present invention includes a transparent substrate, a colored layer including one or more layers that contain a colorant and being arranged to overlap with the transparent substrate, and one or more functional layers arranged to face a surface of the colored layer opposite to that facing the transparent substrate. The colored layer includes one or more layers that contain a first colorant material in which a maximum absorption wavelength is in a range of 470 nm or more and 530 nm or less and a half width of an absorption spectrum thereof is 15 nm or more and 45 nm or less, a second colorant material in which a maximum absorption wavelength is in a range of 560 nm or more and 620 nm or less and a half width of an absorption spectrum thereof is 15 nm or more and 55 nm or less, and a third colorant material in which in a wavelength range of 400 nm to 780 nm, a wavelength at which a transmittance is lowest is in a range of 650 nm or more and 780 nm or less, and each of chromaticness indexes a* and b* of a reflection hue of the optical film that are defined by the following formulas (1) to (9) is in a range from −5 to +5 inclusive. The values a* and b* are calculated from a reflectance R (λ), where the reflectance R (λ) is the reflectance of the optical film on the side of the optical film irradiated with illuminant D65 light from the side closest to an outermost layer of the one or more functional layers in the thickness direction, and a reflectance $R_E$ (λ) of a lowermost layer portion of the transparent substrate is 100% at all wavelengths in a wavelength range of 380 nm to 780 nm. The one or more functional layers include at least an ultraviolet absorption layer in which an ultraviolet shielding rate in accordance with JIS L 1925 is 85% or more.

[Math. 1]

$$a^* = 500\left\{f\left(\frac{X}{X_n}\right) - f\left(\frac{Y}{Y_n}\right)\right\} \quad (1)$$

[Math. 2]

$$b^* = 200\left\{f\left(\frac{X}{Y_n}\right) - f\left(\frac{Z}{Z_n}\right)\right\} \quad (2)$$

[Math. 3]

$$f(t) = \begin{cases} t^{\frac{1}{3}}\left[t \leq \left(\frac{6}{29}\right)^3\right] \\ \frac{1}{3}\left(\frac{29}{6}\right)^2 t + \frac{4}{29}\left[t \leq \left(\frac{6}{29}\right)^3\right] \end{cases} \quad (3)$$

[Math. 4]

$$R1(\lambda)[\%] = \frac{(100 - R2(\lambda))}{100} \times \frac{T(\lambda)}{100} \times \frac{T(\lambda)}{100} \times R_E(\lambda) \quad (4)$$

[Math. 5]

$$R(\lambda)[\%] = R1(\lambda) + R2(\lambda) \quad (5)$$

[Math. 6]

$$X = k \times \int_{380}^{780} P_{D65}(\lambda) \times R(\lambda) \times \bar{x}(\lambda) d\lambda \quad (6)$$

[Math. 7]

$$Y = k \times \int_{380}^{780} P_{D65}(\lambda) \times R(\lambda) \times \bar{y}(\lambda) d\lambda \quad (7)$$

[Math. 8]

$$Z = k \times \int_{380}^{780} P_{D65}(\lambda) \times R(\lambda) \times \bar{z}(\lambda) d\lambda \quad (8)$$

[Math. 9]

$$k = 100 / \int_{380}^{780} P_{D65}(\lambda) \times \bar{y}(\lambda) d\lambda \quad (9)$$

In this case, λ is a variable representing a wavelength, and t is a variable representing a ratio of X, Y, and Z to $X_n$, $Y_n$, and $Z_n$, respectively.

The values a* and b* calculated from the formulas (1) to (3) are calculated according to a calculation method for a CIE 1976 L*a*b*color space, which is a CIELAB color space. In the formulas (1) and (2), $X_n$, $Y_n$, and $Z_n$ are tristimulus values at a white point of illuminant D65.

In the formula (4), $R_E$ (λ) is a function representing a reflectance [%] of a perfect reflecting diffuser, which is 100% at each wavelength, R2 (λ) is a function representing a surface reflectance [%] of an outermost surface of the optical film on the side most distant from the transparent substrate, and T (λ) is a function representing a transmittance [%] of the optical film.

In the formula (6) to (9), $P_{D65}$ (λ) is an illuminant D65 spectrum, and $\bar{x}$ (λ), $\bar{y}$ (λ), and $\bar{z}$ (λ) are CIE 1931 2° color-matching functions.

The definite integrals in formulas (6) to (9) are obtained by appropriate numerical integration. The numerical integration is performed at a wavelength interval of, for example, 1 nm.

In the formula (5), R (λ) represents the reflectance of the optical film for incident light from the side most distant from the transparent substrate, considering internal reflection in the transparent substrate of the optical film.

X, Y, and Z given by the formulas (6) to (8) are tristimulus values at a white point of illuminant D65.

A display device of a second aspect of the present invention includes a light source, and the optical film.

Advantageous Effects of the Invention

The present invention provides an optical film and a display device achieving higher display quality by reducing external light reflection and a longer life of a light emitting element of the display device.

DETAILED DESCRIPTION

Embodiments of the present invention will be described with reference to the accompanying drawings. Throughout the drawings, even in different embodiments, the same or corresponding members are denoted by the same reference signs, and common description is omitted.

First Embodiment

An optical film and a display device according to a first embodiment of the present invention will be described.

Figure 1:
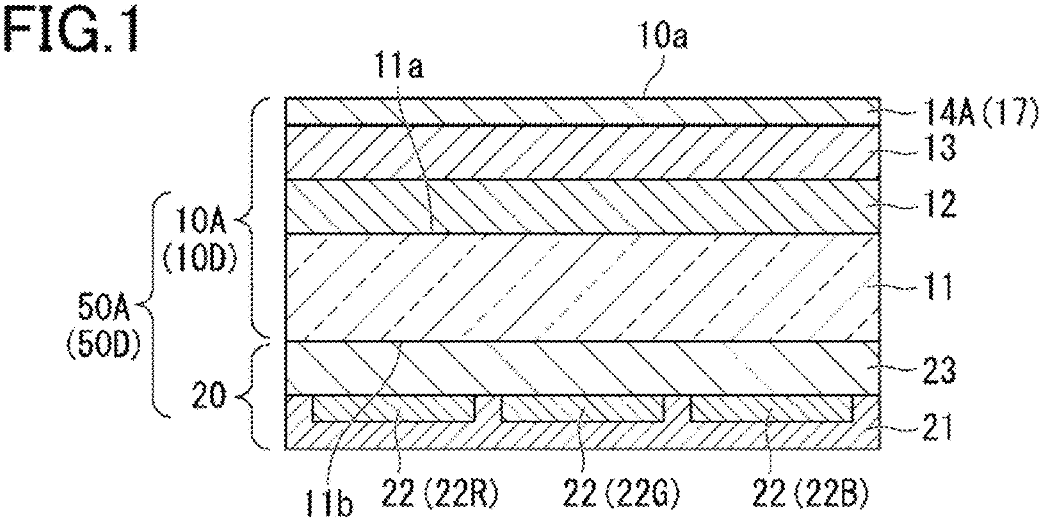
FIG. 1 is a schematic cross-sectional view showing an example of an optical film and a display device according to a first embodiment of the present invention.

FIG. 1 is a schematic cross-sectional view showing an example of the optical film and the display device according to the first embodiment of the present invention.

A display device 50A of the present embodiment whose cross section in the thickness direction is shown in FIG. 1 displays a color image based on an image signal. The display device 50A includes a display unit 20, and an optical film 10A of the present embodiment.

The display unit 20 includes a substrate 21, light emitting elements 22, and a color filter module 23.

The substrate 21 may be composed of, for example, a silicon substrate.

The light emitting elements 22 emit white light. The light emitting elements 22 may be, for example, organic EL (electroluminescent) devices. In an organic EL device, a direct-current voltage is applied between an anode and a cathode to cause an electron and a positive hole to be injected into an organic light emitting layer and recombined to form an exciton, and light generated when the exciton is deactivated is used to emit light. Light from the light emitting elements 22 is emitted in a light emission direction from the lower side toward the upper side of FIG. 1 centering on the optical axis perpendicular to the organic light emitting layer.

The light emitting elements 22 are produced on the substrate 21, for example, using a semiconductor manufacturing process.

An electrode of each of the light emitting elements 22 is connected to a driving circuit (not shown) through a metal wire provided on the substrate 21. The driving circuit controls the ON and OFF states of the light emitting elements 22 based on an image signal.

Each pixel that performs color display includes, as the light emitting elements 22, for example, a first light emitting element 22R that is turned on according to an image signal of a red component, a second light emitting element 22G that is turned on according to an image signal of a green component, and a third light emitting element 22B that is turned on according to an image signal of a blue component.

The color filter module 23 is provided in the light emission direction of each of the light emitting elements 22.

The color filter module 23 includes red filters that allow red light to pass through, green filters that allow green light to pass through, and blue filters that allow blue light to pass through. The red filters are provided to face the first light emitting elements 22R, the green filters are provided to face the second light emitting elements 22G, and the blue filters are provided to face the third light emitting elements 22B.

The color filter module 23 may include a lens that collects light passing through each of the red filters, the green filters, and the blue filters.

The optical film 10A of the present embodiment is provided on the color filter module 23 of the display unit 20. The optical film 10A is used to provide higher color purity in a display region of the display unit 20 to achieve higher display quality by reducing external light reflection.

The optical film 10A includes a transparent substrate 11, a colored layer 12, an ultraviolet absorption layer 13 (functional layer), and a low refractive index layer 14A (functional layer) in this order in the light emission direction of the display unit 20.

The transparent substrate 11 is a plate or a sheet that has a first surface 11*a* and a second surface 11*b* in the thickness direction. The second surface 11*b* of the transparent substrate 11 is positioned on the side of the display unit 20 having the color filter module 23. It is preferable that the transmittance of the material of the transparent substrate 11 to visible light be as close to 100% as possible.

Visible light is light in the visible light wavelength range of 380 nm or more and 780 nm or less.

The material of the transparent substrate 11 may be a transparent resin or inorganic glass such as polyolefin such as polyethylene or polypropylene, polyester such as polybutylene terephthalate or polyethylene naphthalate, polyacrylate such as polymethyl methacrylate, polyamide such as nylon 6 or nylon 66, polyimide, polyarylate, polycarbonate, triacetyl cellulose, polyvinyl alcohol, polyvinyl chloride, cycloolefin copolymer, norbornene-containing resin, polyether sulfone, or polysulphone. Of these, a film made of polyethylene terephthalate (PET), a film made of triacetyl cellulose (TAC), a film made of polymethyl methacrylate (PMMA), and a film made of polyester are preferable. The thickness of the transparent substrate 11 is not particularly limited, but is preferably 10 μm to 100 μm.

The colored layer 12 is a layer portion containing a colorant, and is provided on the first surface 11*a* of the transparent substrate 11 to overlap with the transparent substrate 11.

The colored layer 12 contains, as a colorant, a first colorant material, a second colorant material, and a third colorant material.

In the first colorant material, the maximum absorption wavelength is in the range of 470 nm or more and 530 nm or less, and the half width (full width at half maximum) of the absorption spectrum thereof is 15 nm or more and 45 nm or less. The maximum absorption wavelength indicates a wavelength at which the highest maximum absorbance is obtained in an absorbance spectrum (absorption spectrum). In a transmittance spectrum, this wavelength indicates a wavelength at which the lowest minimum transmittance is obtained. The same applies to the following description.

In the second colorant material, the maximum absorption wavelength is in the range of 560 nm or more and 620 nm or less, and the half width of the absorption spectrum thereof is 15 nm or more and 55 nm or less.

In the third colorant material, a wavelength in the wavelength range of 400 nm to 780 nm at which the transmittance is lowest is in the range of 650 nm or more and 780 nm or less. In the third colorant material, the half width of the absorption spectrum is, for example, 10 nm or more and 300 nm or less, but is not particularly limited.

Hereinafter, the first colorant material, the second colorant material, and the third colorant material may be collectively referred to as simply a colorant material.

The first colorant material, the second colorant material, and the third colorant material contained in the colored layer 12 may contain one or more compounds selected from the group consisting of a compound having a porphyrin structure, a compound having a merocyanine structure, a compound having a phthalocyanine structure, a compound having an azo structure, a compound having a cyanine structure, a compound having a squarylium structure, a compound having a coumarin structure, a compound having a polyene structure, a compound having a quinone structure, a compound having a tetraazaporphyrin structure, a compound having a pyrromethene structure, a compound having an indigo structure, and metal complexes thereof.

The first colorant material, the second colorant material, and the third colorant material particularly preferably contain, for example, a compound having a porphyrin structure, a pyrromethene structure, a phthalocyanine structure, or a squarylium structure in the molecules.

The colored layer 12 of the present embodiment does not contain a dye having a main absorption wavelength range in the wavelength range of 390 to 435 nm.

The colored layer 12 may contain a dye having a main absorption wavelength range in the wavelength range of 390 to 435 nm. However, a dye having a main absorption wavelength range in the wavelength range of 390 to 435 nm does not have a function of providing higher reliability such as higher light resistance and heat resistance, although such a function is intended by the present invention. Thus, the colored layer 12 may contain a dye having a main absorption wavelength range in the wavelength range of 390 to 435 nm simply in order to adjust the color characteristics of the colored layer 12. Furthermore, a functional layer above the colored layer 12 may contain a dye having a main absorption wavelength range in the wavelength range of 390 to 435 nm in order to allow the colored layer 12 to have higher reliability.

In the optical film 10A of the present invention, each of chromaticness indexes (values) a* and b* of a reflection hue of the optical film represented by the formulas (1) to (9) is in the range from −5 to +5 inclusive, where a reflectance R (λ) is the reflectance of the optical film 10A measured from the side closest to a surface 10*a* which is the outermost surface of the optical film 10A on the side opposite to the transparent substrate 11 when the optical film 10A is irradiated with illuminant D65 light from the side closest to the surface 10*a*, and the light is perfectly diffusely reflected on the side closest to the second surface 11*b* of the lowermost layer of the optical film. The hue is represented by a three-dimensional orthogonal coordinate system with axes representing three values: the value represented by the formula (1), the value represented by the formula (2), and a lightness index L* represented by the following formula (10). The three-dimensional orthogonal coordinate system is a uniform color space defined by the International Commission on Illumination (CIE) (also referred to as CIE 1976 L*a*b* color space or CIELAB color space).

[Math. 10]

$$L^* = 116 \times \left(\frac{Y}{Y_n}\right)^{\frac{1}{3}} - 16 \quad (10)$$

In this case, Y is a tristimulus value for reflected light with the reflectance R (λ) for illuminant D65, and is calculated from the formulas (4), (5), (7) and (9), and $Y_n$ is a tristimulus value at the white point of illuminant D65.

Figure 2:
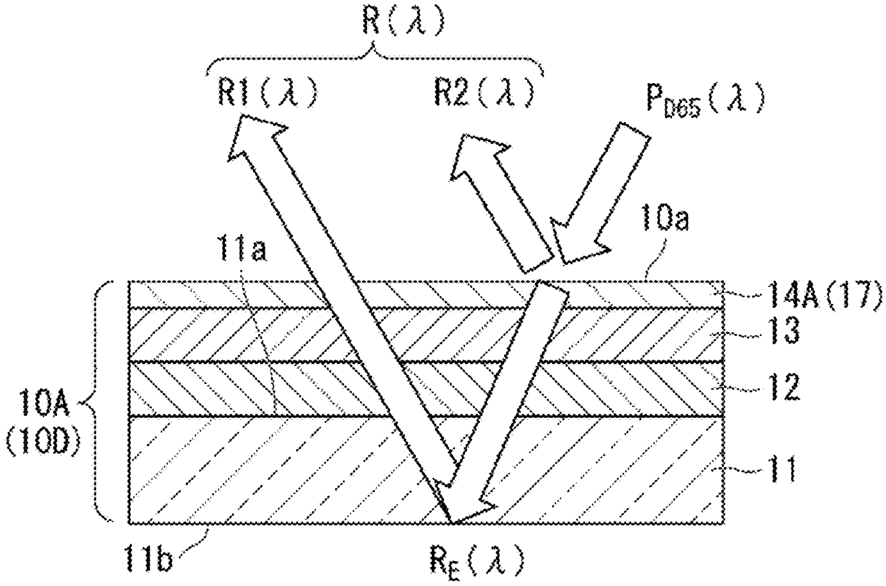
FIG. 2 is an explanatory diagram of a method of calculating chromaticness indexes a* and b* of a reflection hue of the optical film of the present invention.

The method of calculating the chromaticness indexes a* and b* as indicators of an external light reflection hue of the optical film of the present invention will be described in detail with reference to FIG. 2.

When the optical film 10A is irradiated with illuminant D65 light from the surface 10*a* of the optical film 10A opposite to the second surface 11*b* of the transparent substrate 11 in the thickness direction, light emerging from the optical film 10A can be divided into a surface reflection component and an internal reflection component. The surface reflection component is defined by R2 (λ) [%], which is the surface reflectance of the surface 10*a*. The internal reflection component is defined by R1 (λ) [%] calculated from the formula (4) using a reflectance $R_E$ (λ) [%] of a perfect reflecting diffuser, which is 100% irrespective of the wavelength, a transmittance T (λ) of the optical film 10A, and the surface reflectance R2 (λ) [%] of the surface 10*a*.

R (λ) [%] is calculated from the formula (5), where R (λ) is the reflectance of the optical film 10A on the side closest to the surface 10*a* irradiated with illuminant D65 light.

R (λ) is a function of wavelength λ as with R1 (λ) and R2 (λ), and thus tristimulus values X, Y, and Z are determined by calculating definite integrals for λ in the formulas (6) to (9). The definite integrals may be obtained by appropriate numerical integration. For example, the numerical integration may be performed at a wavelength interval such as an equal interval of, for example, 1 nm.

As described above, X, Y, and Z in the formulas (1) and (2) are the tristimulus values for reflected light with the reflectance R (λ) for illuminant D65 of the optical film 10A on the side closest to the surface 10*a*, and $X_n$, $Y_n$, and $Z_n$ represent the tristimulus values at the white point of illuminant D65. These values can be used to calculate the chromaticness indexes a* and b* as the indicators of the external light reflection hue of the optical film 10A. Each of the chromaticness indexes (values) a* and b* of the hue of the optical film 10A is preferably in the range from −5 to +5 inclusive from the viewpoint of achieving higher display quality by reducing external light reflection. The internal reflectance for light reflected by an internal surface such as a display unit or an electrode wiring portion of a self-luminous display device such as an organic light emitting display device typically has different values at wavelengths in the wavelength range of 380 nm to 780 nm. However, as a result of intensive study, the inventors of the present invention have found that when each of the chromaticness indexes (values) a* and b* of the external light reflection hue of the optical film 10A is in the range from −5 to +5 inclusive, and $R_E$ (λ) as the reflectance of a perfect reflecting diffuser, which is 100% at all wavelengths, is substituted with the internal reflectance of the display unit 20 of an actual self-luminous display device, the chromaticness indexes a* and b* as the indicators of the external light reflection hue are in the range from −5 to +5 inclusive, achieving high display quality.

The colored layer 12 having such a configuration has, as a whole, the maximum absorption wavelengths in the range of 470 nm or more and 530 nm or less and in the range of 560 nm or more and 620 nm or less, and further contains the third colorant material in which the maximum absorption in the range of 400 nm to 780 nm is in the range of 650 nm or more and 780 nm or less, thus achieving a spectral absorption spectrum having the minimum absorption wavelength in the range of 620 nm to 780 nm. This allows most of red light, green light, and blue light emerging from the display unit 20 to pass through the colored layer 12.

On the other hand, the colored layer 12 reduces the amount of transmitted light for part of each of a wavelength component between the maximum wavelength of red light and the maximum wavelength of green light, a wavelength component between the maximum wavelength of green light and the maximum wavelength of blue light, ultraviolet light, and infrared light. Thus, for example, of reflected light of external light reflected by the wire or the like of the display unit 20, a wavelength component that reduces the color purity for display light is absorbed by the colored layer 12.

The colored layer 12 may contain, as an additive, at least one of a radical scavenger, a singlet oxygen quencher, and a peroxide decomposer. When the colored layer 12 contains such an additive, as described below, it is possible to prevent the colorant materials contained in the colored layer 12 from fading due to light, heat, or the like, thus achieving higher durability.

A radical scavenger serves to prevent autooxidation by capturing radicals when oxidative degradation of a colorant occurs, and prevents deterioration (fading) of the colorant. When the colored layer 12 contains, as a radical scavenger, a hindered amine light stabilizer having a molecular weight of 2,000 or more, the colored layer 12 has a high fading prevention effect. If the colored layer 12 contains a radical scavenger having a small molecular weight, which easily evaporates, only a small number of molecules remain in the colored layer, making it difficult for the colored layer 12 to have a sufficient fading prevention effect. A material suitable as a radical scavenger is, for example, Chimassorb (registered trademark) 2020 FDL, Chimassorb (registered trademark) 944 FDL, or Tinuvin (registered trademark) 622 manufactured by BASF, or LA-63P manufactured by Adeka Corporation.

A singlet oxygen quencher serves to inactivate highly reactive singlet oxygen that easily causes oxidative degradation (fading) of a colorant, to prevent oxidative degradation (fading) of the colorant. Examples of a singlet oxygen quencher include transition metal complexes, colorants, amines, phenols, and sulfides. A material particularly suitable as a singlet oxygen quencher is a transition metal complex of dialkyl phosphate, dialkyl dithiocarbamate, or benzenedithiol, and a material suitable as a central metal is nickel, copper, or cobalt. The singlet oxygen quencher may be, for example, NKX1199, NKX113, or NKX114 manufactured by Hayashibara Biochemical Laboratories, Inc., Research Institute for Photosensitizing Dyes, or D1781, B1350, B4360, or T3204 manufactured by Tokyo Chemical Industry Co., Ltd.

A peroxide decomposer serves to decompose a peroxide generated when oxidative degradation of a colorant occurs, and stop the autooxidation cycle to prevent deterioration (fading) of the colorant. A peroxide decomposer may be a phosphorus-based antioxidant or a sulfur-based antioxidant.

Examples of a phosphorus-based antioxidant include 2,2'-methylenebis(4,6-di-t-butyl-1-phenyloxy)(2-ethylhexyloxy) phosphorus, 3,9-bis(2,6-di-tert-butyl-4-methylphenoxy)-2,4,8,10-tetraoxa-3,9-diphosphaspiro[5.5]undecane, and 6-[3-(3-t-butyl-4-hydroxy-5-methylphenyl)propoxy]-2,4,8,10-tetra-t-butyldibenz[d,f][1,3,2]dioxaphosphepine.

Examples of a sulfur-based antioxidant include 2,2-bis({[3-(dodecylthio)propionyl]oxy}methyl)-1,3-propanediyl-bis[3-(dodecylthio)propionate], 2-mercaptobenzimidazole, dilauryl-3,3'-thiodipropionate, dimyristyl-3,3'-thiodipropionate, distearyl-3,3'-thiodipropionate, pentaerythrityl-tetrakis(3-laurylthiopropionate), and 2-mercaptobenzothiazole.

The ultraviolet absorption layer 13 is a layer portion having an ultraviolet shielding rate of 85% or more. The ultraviolet shielding rate is measured and calculated based on JIS L1925, and is represented by a value [%] obtained by subtracting, from 100%, the average transmittance (unit: [%]) in the wavelength range of 290 nm to 400 nm.

The absorption wavelength range in the ultraviolet region of the ultraviolet absorption layer 13 is more preferably the range of 290 nm or more and 370 nm or less. The absorption wavelength range is defined as a wavelength region in which the ultraviolet absorption rate is 90% or more.

The ultraviolet absorption layer 13 is provided on the side opposite to the transparent substrate 11 via the colored layer 12. In the example shown in FIG. 1, the ultraviolet absorption layer 13 is laminated on the colored layer 12; however, the ultraviolet absorption layer 13 may be provided on the colored layer 12 via another layer.

The colorant materials contained in the colored layer 12 have a good color correction function, but have insufficient resistance to light, particularly ultraviolet light. Thus, when the colorant materials are irradiated with ultraviolet light, the colorant materials deteriorate with time and can no longer absorb light having a wavelength near the maximum absorption wavelength.

In the present embodiment, the optical film 10A includes the ultraviolet absorption layer 13 provided so that external light arrives at the ultraviolet absorption layer 13 before the colored layer 12, thus reducing the amount of ultraviolet light contained in external light that enters the colored layer 12. This allows the colored layer 12 to have higher resistance to ultraviolet light.

The ultraviolet absorption layer 13 is formed by applying and drying a composition containing an energy ray-curable resin, a photopolymerization initiator, an ultraviolet absorber, and a solvent, followed by irradiation with an energy ray such as ultraviolet light to cure the composition.

The energy ray-curable resin contained in the ultraviolet absorption layer 13 is a resin that is polymerized and cured by irradiation with an active energy ray such as ultraviolet light or an electron beam, and may be, for example, monofunctional, bifunctional, or tri- or more functional (meth) acrylate monomer. Herein, "(meth)acrylate" collectively refers to both acrylate and methacrylate, and "(meth)acryloyl" collectively refers to both acryloyl and methacryloyl.

Examples of a monofunctional (meth)acrylate compound include 2-hydroxyethyl (meth)acrylate, 2-hydroxypropyl (meth)acrylate, 2-hydroxybutyl (meth)acrylate, n-butyl (meth)acrylate, isobutyl (meth)acrylate, t-butyl (meth)acrylate, glycidyl (meth)acrylate, acryloylmorpholine, N-vinylpyrrolidone, tetrahydrofurfuryl acrylate, cyclohexyl (meth)acrylate, 2-ethylhexyl (meth)acrylate, isobornyl (meth)acrylate, isodecyl (meth)acrylate, lauryl (meth)acrylate, tridecyl (meth)acrylate, cetyl (meth)acrylate, stearyl (meth)acrylate, benzyl (meth)acrylate, 2-ethoxyethyl (meth) acrylate, 3-methoxybutyl (meth)acrylate, ethyl carbitol (meth)acrylate, phosphoric acid (meth)acrylate, ethylene oxide-modified phosphoric acid (meth)acrylate, phenoxy (meth)acrylate, ethylene oxide-modified phenoxy (meth) acrylate, propylene oxide-modified phenoxy (meth)acrylate, nonylphenol (meth)acrylate, ethylene oxide-modified nonylphenol (meth)acrylate, propylene oxide-modified nonylphenol (meth)acrylate, methoxy diethylene glycol (meth) acrylate, methoxy polyethylene glycol (meth)acrylate, methoxy propylene glycol (meth)acrylate, 2-(meth)acryloyl oxyethyl-2-hydroxypropyl phthalate, 2-hydroxy-3-phenoxy propyl (meth)acrylate, 2-(meth)acryloyl oxyethyl hydrogen phthalate, 2-(meth)acryloyl oxypropyl hydrogen phthalate, 2-(meth)acryloyl oxypropyl hexahydro hydrogen phthalate, 2-(meth)acryloyl oxypropyl tetrahydro hydrogen phthalate, dimethylaminoethyl (meth)acrylate, trifluoroethyl (meth) acrylate, tetrafluoropropyl (meth)acrylate, hexafluoropropyl (meth)acrylate, octafluoropropyl (meth)acrylate, and adamantane derivative mono(meth)acrylates such as adamantyl acrylate having a monovalent mono(meth)acrylate derived from 2-adamantane or adamantane diol.

Examples of a bifunctional (meth)acrylate compound include di(meth)acrylates such as ethylene glycol di(meth) acrylate, diethylene glycol di(meth)acrylate, butanediol di(meth)acrylate, hexanediol di(meth)acrylate, nonanediol di(meth)acrylate, ethoxylated hexanediol di(meth)acrylate, propoxylated hexanediol di(meth)acrylate, diethylene glycol di(meth)acrylate, polyethylene glycol di(meth)acrylate, tripropylene glycol di(meth)acrylate, polypropylene glycol di(meth)acrylate, neopentyl glycol di(meth)acrylate, ethoxylated neopentyl glycol di(meth)acrylate, tripropylene glycol di(meth)acrylate, and hydroxypivalic acid neopentyl glycol di(meth)acrylate.

Examples of a tri- or higher functional (meth)acrylate compound include tri(meth)acrylates such as trimethylolpropane tri(meth)acrylate, ethoxylated trimethylolpropane tri(meth)acrylate, propoxylated trimethylolpropane tri (meth)acrylate, tris 2-hydroxyethyl isocyanurate tri(meth) acrylate, and glycerin tri(meth)acrylate, trifunctional (meth) acrylate compounds such as pentaerythritol tri(meth) acrylate, dipentaerythritol tri(meth)acrylate, and ditrimethylolpropane tri(meth)acrylate, tri- or higher functional polyfunctional (meth)acrylate compounds such as pentaerythritol tetra(meth)acrylate, ditrimethylolpropane tetra(meth)acrylate, dipentaerythritol tetra(meth)acrylate, dipentaerythritol penta(meth)acrylate, ditrimethylolpropane penta(meth)acrylate, dipentaerythritol hexa(meth)acrylate, and ditrimethylolpropane hexa(meth)acrylate, and polyfunctional (meth)acrylate compounds obtained by substituting part of any of these (meth)acrylates with an alkyl group or ε-caprolactone.

As an active energy ray-curable resin, a urethane (meth) acrylate may be used. The urethane (meth)acrylate may be obtained, for example, by reacting a (meth)acrylate monomer having a hydroxyl group with a product obtained by reacting an isocyanate monomer or a prepolymer with a polyester polyol.

Examples of the urethane (meth)acrylate include pentaerythritol triacrylate hexamethylene diisocyanate urethane prepolymer, dipentaerythritol pentaacrylate hexamethylene diisocyanate urethane prepolymer, pentaerythritol triacrylate toluene diisocyanate urethane prepolymer, dipentaerythritol pentaacrylate toluene diisocyanate urethane prepolymer, pentaerythritol triacrylate isophorone diisocyanate urethane prepolymer, and dipentaerythritol pentaacrylate isophorone diisocyanate urethane prepolymer.

The above resins may be used singly or in combination of two or more. The above resins may be monomers or partially polymerized oligomers in a composition for forming a hard coat layer.

The ultraviolet absorber contained in the ultraviolet absorption layer 13 may be, for example, a benzophenone-based, a benzotriazole-based, a triazine-based, an oxalic acid anilide-based, or a cyanoacrylate-based compound. The ultraviolet absorption layer 13 preferably contains one or more of these compounds so that the absorption wavelength range in the ultraviolet region of the ultraviolet absorber is range of 290 nm to 370 nm.

The ultraviolet absorption layer 13 preferably contains one or more photopolymerization initiators having an absorption wavelength range in the ultraviolet region different from the absorption wavelength range in the ultraviolet region of the ultraviolet absorber. In such a case, an energy ray-curable compound can be cured by irradiation with light in the ultraviolet region that is not absorbed by the ultraviolet absorber, thus leading to efficient formation of a cured film. When the absorption wavelength range of the ultraviolet absorber is the range of 290 nm to 370 nm, an acylphosphine oxide-based photopolymerization initiator having an absorption wavelength range different from the absorption wavelength range of the ultraviolet absorber can be suitably used, and the photopolymerization initiator may be, for example, diphenyl(2,4,6-trimethylbenzoyl) phosphine oxide, phenylbis(2,4,6-trimethylbenzoyl) phosphine oxide, or the like. The use of an ultraviolet absorber and a photopolymerization initiator having different absorption wavelength ranges can prevent inhibition of curing during formation of an ultraviolet absorption layer containing the ultraviolet absorber, and can prevent, after curing, deterioration of the colorant contained in the colored layer 12 due to irradiation with ultraviolet light.

Other examples of the photopolymerization initiator contained in the composition for forming the ultraviolet absorption layer 13 include 2,2-ethoxyacetophenone, 1-hydroxycyclohexyl phenyl ketone, dibenzoyl, benzoin, benzoin methyl ether, benzoin ethyl ether, p-chlorobenzophenone, p-methoxybenzophenone, Michler's ketone, acetophenone, and 2-chlorothioxanthone. These materials may be used singly or in combination of two or more.

Examples of the solvent contained in the composition for forming the ultraviolet absorption layer 13 include ethers such as dibutyl ether, dimethoxymethane, dimethoxyethane, diethoxyethane, propylene oxide, 1,4-dioxane, 1,3-dioxolane, 1,3,5-trioxane, tetrahydrofuran, anisole, and phenetole, ketones such as acetone, methyl ethyl ketone, diethyl ketone, dipropyl ketone, diisobutyl ketone, methyl isobutyl ketone, cyclopentanone, cyclohexanone, and methylcyclohexanone, esters such as ethyl formate, propyl formate, n-pentyl formate, methyl acetate, ethyl acetate, methyl propionate, ethyl propionate, n-pentyl acetate, and γ-butyrolactone, and cellosolves such as methyl cellosolve, cellosolve, butyl cellosolve, and cellosolve acetate. These materials may be used singly or in combination of two or more.

In the present embodiment, the optical film 10A including the ultraviolet absorption layer 13 has, as a surface hardness, a pencil hardness of H or more at a load of 500 g. The pencil hardness is measured based on JIS-K 5600-5-4: 1999.

Thus, the ultraviolet absorption layer 13 of the present embodiment functions as an ultraviolet protective layer that protects the colored layer 12 from ultraviolet light entering from the outside of the optical film 10A, and also functions as a hard coat layer that protects the colored layer 12 against external loads.

The ultraviolet absorption layer 13 serving as both an ultraviolet protective layer and a hard coat layer as in the present embodiment can be obtained, for example, by producing a hard resin layer using any of the materials described above as an energy ray-curable resin and adjusting the balance between the absorption wavelength of an ultraviolet absorber and the absorption wavelength of a photopolymerization initiator to prevent inhibition of curing.

In order to adjust the refractive index of the hard coat layer and to impart hardness to the hard coat layer, the ultraviolet absorption layer 13 may contain metal oxide fine particles. Examples of metal oxide fine particles include fine particles of zirconium oxide, titanium oxide, niobium oxide, antimony trioxide, antimony pentoxide, tin oxide, indium oxide, indium tin oxide, and zinc oxide.

In order to impart at least one of water repellency and oil repellency to the ultraviolet absorption layer 13 to achieve higher antifouling properties, the ultraviolet absorption layer 13 may contain any of a silicon oxide, a fluorine-containing silane compound, a fluoroalkylsilazane, a fluoroalkylsilane, a fluorine-containing silicon compound, and a perfluoropolyether group-containing silane coupling agent.

The ultraviolet absorption layer 13 may further contain, as other additives, a leveling agent, an antifoaming agent, an antioxidant, a photostabilizer, a photosensitizer, a conductive material, and the like.

In the optical film 10A applied to the display device 50A, the low refractive index layer 14A is located closest to a user (viewer) who views a display. In the present embodiment, the low refractive index layer 14A is laminated on the surface of the ultraviolet absorption layer 13 facing away from the colored layer 12. The thickness of the low refractive index layer 14A is not particularly limited, and may be, for example, approximately 40 nm to 1 μm.

The low refractive index layer 14A is made of a material having a lower refractive index than the ultraviolet absorption layer 13. Thus, interference occurs between reflected light of external light entering from the outside that is reflected by the interface between the ultraviolet absorption layer 13 and the low refractive index layer 14A and reflected light reflected by the surface of the low refractive index layer 14A, achieving a lower surface reflectance for external light.

The low refractive index layer 14A can reduce surface reflection of external light, achieving better visibility of the display device 50A.

The low refractive index layer 14A is a layer portion made of an inorganic material or an inorganic compound. The inorganic material or inorganic compound may be, for example, fine particles of LiF, MgF, 3NaF·AlF, AlF, or $Na_3AlF_6$, silica fine particles, or the like. As silica fine particles, fine particles having voids inside the particles such as porous silica fine particles or hollow silica fine particles are effective to allow the low refractive index layer 14A to have a low refractive index. A composition for forming the low refractive index layer may appropriately contain any of the materials described as a photopolymerization initiator, a solvent, and other additives for the ultraviolet absorption layer 13.

The material of the low refractive index layer 14A may further contain any of a silicon oxide, a fluorine-containing silane compound, fluoroalkylsilazane, fluoroalkylsilane, a fluorine-containing silicon compound, and a perfluoropolyether group-containing silane coupling agent. Such a material can impart at least one of water repellency and oil repellency to the low refractive index layer 14A, achieving higher antifouling properties.

In the optical film 10A of the present embodiment, the ultraviolet absorption layer 13 and the low refractive index layer 14A constitute one or more functional layers that are provided on the side opposite to the transparent substrate via the colored layer.

The optical film 10A may include an appropriate functional layer between the colored layer 12 and the ultraviolet absorption layer 13 as long as the optical film 10A can achieve the necessary frontal luminance, external light reflection visibility, and color purity for display light.

The optical film 10A can be produced by forming, on the first surface 11*a* of the transparent substrate 11, the colored layer 12, the ultraviolet absorption layer 13, and the low refractive index layer 14A in this order.

The colored layer 12, the ultraviolet absorption layer 13, and the low refractive index layer 14A can each be formed, for example, by applying and drying a corresponding one of coating liquids each containing the constituent materials of a respective one of the layers, followed by irradiation with an active energy ray such as ultraviolet light to cure the coating liquid. The low refractive index layer 14A can also be formed by vapor deposition, sputtering, or the like.

A composition for forming the colored layer 12 contains an active energy ray-curable resin, a photopolymerization initiator, a colorant, and a solvent, and may further contain an additive as necessary. The composition for forming the colored layer 12 may contain any of the materials described as an active energy ray-curable resin, a photopolymerization initiator, and a solvent for the ultraviolet absorption layer 13.

The composition for forming the colored layer 12 contains, as a colorant, the first colorant material, the second colorant material, and the third colorant material described above. The composition for forming the colored layer 12 may contain, as an additive, at least one of a radical scavenger, a peroxide decomposer, and a singlet oxygen quencher.

The ultraviolet absorption layer 13 can be formed by applying a composition containing at least an energy ray-curable compound, a photopolymerization initiator, an ultraviolet absorber, and a solvent onto the colored layer 12, followed by irradiation with an energy ray for starting photopolymerization to cure the composition.

The low refractive index layer 14A can be formed by applying a material for forming the low refractive index layer 14A onto the ultraviolet absorption layer 13, followed by irradiation with an energy ray for starting photopolymerization to cure the composition, as with the ultraviolet absorption layer 13.

The display device 50A can be produced by preparing the display unit 20, and bonding and fixing the second surface 11*b* of the transparent substrate 11 of the optical film 10A to a surface of the color filter module 23 via an adhesive layer or the like.

In the display device 50A of the present embodiment, when the light emitting elements 22 are turned on according to an image signal, display light generated by the light emitting elements 22 passes through the color filter module 23. Thus, light from the first light emitting elements 22R, light from the second light emitting elements 22G, and light from the third light emitting elements 22B pass, as red light, green light, and blue light, respectively, through the transparent substrate 11, the colored layer 12, the ultraviolet absorption layer 13, and the low refractive index layer 14A to the outside of the optical film 10A.

In this case, the colored layer 12 has a good transmittance to light with red, green, and blue wavelengths in the display light, and thus allows each display light to pass through while the color purity is maintained.

The ultraviolet absorption layer 13 mainly absorbs light in the ultraviolet region, and thus allows the display light to pass through with almost no reduction in luminance.

The low refractive index layer 14A has a good transmittance to visible light, and thus allows the display light to pass through to the outside with almost no reduction in luminance.

On the other hand, external light enters the display device 50A through the optical film 10A.

The low refractive index layer 14A reduces the surface reflectance for external light, and thus prevents poor visibility due to excessive surface reflection of the external light.

When the external light enters the ultraviolet absorption layer 13, a wavelength component in the ultraviolet region of the external light is absorbed by the ultraviolet absorber, and then enters the colored layer 12.

The colored layer 12 further absorbs wavelength components of the external light near the absorption wavelengths of the colorant materials contained in the colored layer 12. Then, the external light passes through the transparent substrate 11 and the color filter module 23, and reaches the substrate 21. The substrate 21 includes, for example, metal portions having a high reflectance such as wires and electrodes.

Thus, the external light is reflected by the wires, the electrodes, or the like, and sequentially passes through the color filter module 23, the transparent substrate 11, the colored layer 12, the ultraviolet absorption layer 13, and the low refractive index layer 14A to the outside.

An observer of the display device 50A observes, in addition to display light, reflected light obtained by combining surface reflected light of external light from the display device 50A and internal reflected light of external light transmitted through and reflected by internal portions of the display device 50A.

In the present embodiment, external light passes through the colored layer 12 twice to the outside to reduce a wavelength component different from the wavelength component of display light; thus, it is possible to prevent a reduction in luminance of display light while reducing internal reflection of external light, maintaining good color purity for display light even when external light is superimposed on the display light.

Even while the display device 50A performs no display, when the chromaticness indexes a* and b* as the indicators of the external light reflection hue of the optical film 10A are from −5 to +5 inclusive, the influence of the color of the optical film is small, and thus the blackness of the display screen is maintained.

In the present embodiment, the ultraviolet absorption layer 13 absorbs ultraviolet light components of external light, preventing deterioration of the colorant materials when the colored layer 12 is irradiated with ultraviolet light. Thus, the spectral characteristics of the colorant materials of the colored layer 12 are more likely to be maintained with time.

Second Embodiment

An optical film and a display device according to a second embodiment of the present invention will be described.

Figure 3:
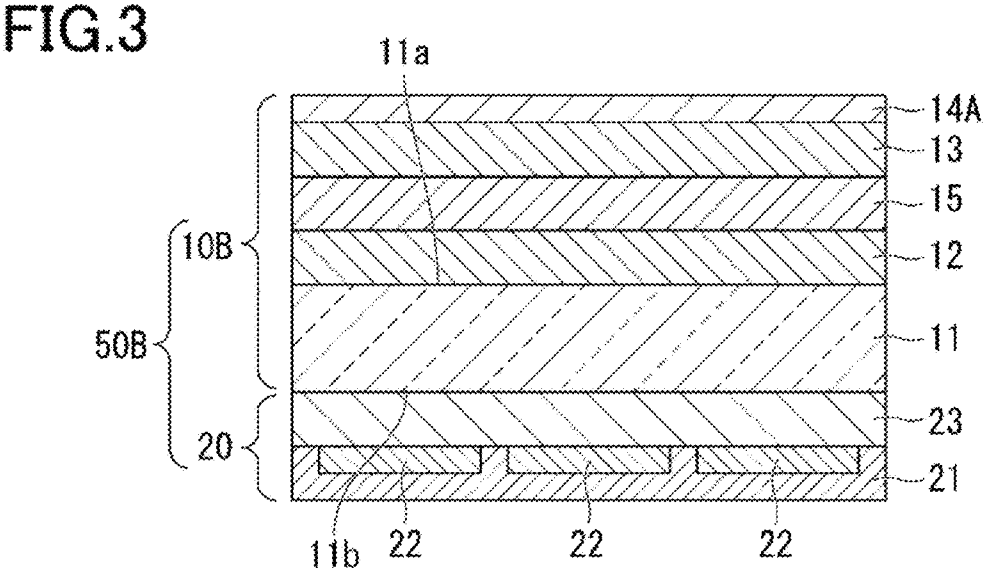
FIG. 3 is a schematic cross-sectional view showing an example of an optical film and a display device according to a second embodiment of the present invention.

FIG. 3 is a schematic cross-sectional view showing an example of the optical film and the display device according to the second embodiment of the present invention.

A display device 50B of the present embodiment whose cross section in the thickness direction is shown in FIG. 3 includes an optical film 10B of the present embodiment instead of the optical film 10A of the display device 50A of the first embodiment.

The optical film 10B has the same configuration as the optical film 10A except that the optical film 10B includes an oxygen barrier layer 15 (functional layer) between the colored layer 12 and the ultraviolet absorption layer 13.

The following description will focus on differences from the first embodiment.

The oxygen barrier layer 15 is a transparent layer that allows light to pass through. The oxygen barrier layer 15 has an oxygen permeability of 10 $cc/m^2 \cdot day \cdot atm$ or less. The main constituent material of the oxygen barrier layer 15 is preferably polyvinyl alcohol (PVA), ethylene-vinyl alcohol copolymer (EVOH), vinylidene chloride, siloxane resin, or the like, and may be, for example, Maxive (registered trademark) manufactured by Mitsubishi Gas Chemical Company, Inc., EVAL or Poval manufactured by Kuraray Co., Ltd., or Saran latex or Saran resin manufactured by Asahi Kasei Corporation. In the oxygen barrier layer 15, inorganic particles such as silica particles, alumina particles, silver particles, copper particles, titanium particles, zirconia particles, or tin particles may be dispersed to reduce the oxygen permeability.

When the optical film 10B is attached to the display device 50B, oxygen contained in the outside air would have to pass through the oxygen barrier layer 15 to reach the colored layer 12. This prevents deterioration of the colorant materials of the colored layer 12 due to oxygen in the outside air. Thus, the light absorption performance of the colored layer 12 is maintained for a long time.

In the present embodiment, instead of or in addition to the oxygen barrier layer 15, the optical film 10B may include an oxygen barrier layer on the side closest to the second surface 11*b* of the transparent substrate 11. In such a case, the oxygen barrier layer protects the colorant materials of the colored layer 12 from oxygen present in the display device 50B.

The optical film 10B and the display device 50B of the present embodiment include the colored layer 12, the ultraviolet absorption layer 13, and the low refractive index layer 14A as in the first embodiment, and thus have the same effects as in the first embodiment.

In particular, the optical film 10B of the present embodiment further includes the oxygen barrier layer 15, and can thus prevent oxidative degradation of the colorant of the colored layer 12 due to the influence of oxygen.

Third Embodiment

An optical film and a display device according to a third embodiment of the present invention will be described.

Figure 4:
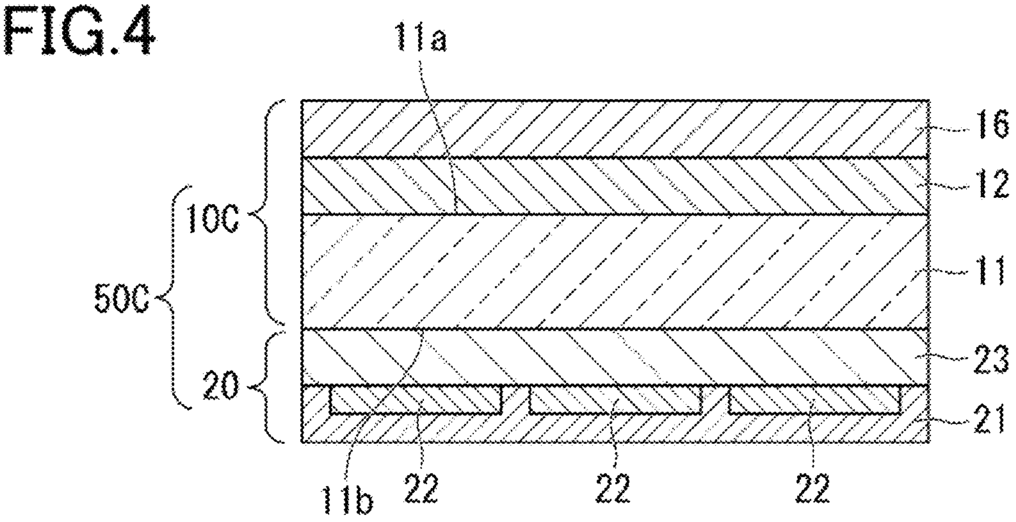
FIG. 4 is a schematic cross-sectional view showing an example of an optical film and a display device according to a third embodiment of the present invention.

FIG. 4 is a schematic cross-sectional view showing an example of the optical film and the display device according to the third embodiment of the present invention.

A display device 50C of the present embodiment whose cross section in the thickness direction is shown in FIG. 4 includes an optical film 10C of the present embodiment instead of the optical film 10A of the display device 50A of the first embodiment.

The optical film 10C has the same configuration as the optical film 10A except that the optical film 10C includes an ultraviolet absorption antiglare layer 16 (ultraviolet absorption layer, functional layer, antiglare layer) instead of the low refractive index layer 14A and the ultraviolet absorption layer 13.

The following description will focus on differences from the first embodiment.

The ultraviolet absorption antiglare layer 16 is a layer portion having ultraviolet absorption properties and an antiglare function.

The ultraviolet absorption antiglare layer 16 has an ultraviolet shielding rate of 85% or more as with the ultraviolet absorption layer 13. The ultraviolet absorption antiglare layer 16 more preferably has an absorption wavelength range in the range of 290 nm or more and 370 nm or less.

The antiglare function is a function of scattering external light using a fine uneven structure on the surface to reduce glare due to external light.

The ultraviolet absorption antiglare layer 16 has a pencil hardness of H or more as with the ultraviolet absorption layer 13.

The ultraviolet absorption antiglare layer 16 can be formed by curing a coating liquid containing the same composition as the composition for forming the ultraviolet absorption layer 13 and at least organic fine particles or inorganic fine particles that impart an antiglare function. The organic fine particles are to form a fine uneven structure on the surface of the ultraviolet absorption antiglare layer 16 to impart a function of diffusing external light, and may be, for example, resin particles of an optically transmissive resin material such as an acrylic resin, a polystyrene resin, a styrene-(meth)acrylic ester copolymer, a polyethylene resin, an epoxy resin, a silicone resin, a polyvinylidene fluoride, or a polyethylene fluoride resin. The organic fine particles may be a mixture of two or more types of resin particles of different materials (with different refractive indexes) in order to adjust the refractive index and the dispersibility of the resin particles. The inorganic fine particles are to adjust the precipitation and aggregation of the organic fine particles in the ultraviolet absorption antiglare layer 16, and may be silica fine particles, metal oxide fine particles, various mineral fine particles, or the like. The silica fine particles may be, for example, silica fine particles surface-modified with a reactive functional group such as colloidal silica or a (meth) acryloyl group. The metal oxide fine particles may be fine particles of, for example, alumina, zinc oxide, tin oxide, antimony oxide, indium oxide, titania, zirconia, or the like. The mineral fine particles may be fine particles of, for example, mica, synthetic mica, vermiculite, montmorillonite, iron montmorillonite, bentonite, beidellite, saponite, hectorite, stevensite, nontronite, magadiite, ilerite, kanemite, layered titanate, smectite, synthetic smectite, or the like. The mineral fine particles may be a natural product or a synthetic product (including a substitution product and a derivative), or may be a mixture of a natural product and a synthetic product. The mineral fine particles are more preferably made of layered organoclay. A layered organoclay is a material in which organic onium ions are introduced between layers of swelling clay. Layered organoclay may contain any organic onium ions that can organically modify swelling clay using the cation exchange properties of the swelling clay. When layered organoclay mineral particles are used as mineral fine particles, synthetic smectite can be suitably used as described above. Synthetic smectite has a function of increasing the viscosity of a coating liquid for forming an antiglare layer to prevent precipitation of resin particles and inorganic fine particles, adjusting the uneven shape of the surface of an optical functional layer.

The composition for forming the ultraviolet absorption antiglare layer 16 may contain any of a silicon oxide, a fluorine-containing silane compound, fluoroalkylsilazane, fluoroalkylsilane, a fluorine-containing silicon compound, and a perfluoropolyether group-containing silane coupling agent. Such a material can impart at least one of water repellency and oil repellency to the ultraviolet absorption antiglare layer 16, allowing the optical film 10C to have improved antifouling properties.

The ultraviolet absorption antiglare layer 16 may be configured such that a layer having a relatively high refractive index and a layer having a relatively low refractive index are sequentially laminated from the side closest to the colored layer 12. The ultraviolet absorption antiglare layer 16 containing unevenly distributed materials can be formed, for example, by applying a composition containing a low refractive index material containing surface-modified silica fine particles or hollow silica fine particles and a high refractive index material, and performing phase separation using the difference in surface free energy between the two materials. When the ultraviolet absorption antiglare layer 16 is composed of two layers obtained by phase separation, the ultraviolet absorption antiglare layer 16 is preferably configured such that the layer having a relatively high refractive index on the side closest to the colored layer 12 has a refractive index of 1.50 to 2.40 and that the layer having a relatively low refractive index on the side closest to the surface of the optical film 10C has a refractive index of 1.20 to 1.55.

The optical film 10C of the present embodiment is an example in which the ultraviolet absorption antiglare layer 16 as an ultraviolet absorption layer also serves as an antiglare layer.

The optical film 10C and the display device 50C of the present embodiment include the colored layer 12 as in the first embodiment, and the ultraviolet absorption antiglare layer 16 having the ultraviolet absorption properties as with the ultraviolet absorption layer 13, and thus have the same effects as in the first embodiment.

In particular, the optical film 10C of the present embodiment includes the ultraviolet absorption antiglare layer 16 that also serves as an antiglare layer, causing external light to be scattered in the ultraviolet absorption antiglare layer 16. This reduces surface reflection and glare of external light, achieving better visibility of the display screen and display light, thus preventing lower display quality due to external light reflection.

First Modification

An optical film and a display device according to a modification (first modification) of the third embodiment of the present invention will be described.

A display device 50D of the present modification whose cross section in the thickness direction is shown in FIG. 1 includes an optical film 10D of the present modification instead of the optical film 10C of the display device 50C of the third embodiment.

The optical film 10D has the same configuration as the optical film 10C except that the optical film 10D includes the ultraviolet absorption layer 13 as in the first embodiment and an antiglare layer 17 (functional layer) instead of the ultraviolet absorption antiglare layer 16.

The following description will focus on differences from the third embodiment.

The antiglare layer 17 is a layer portion having an antiglare function. The placement of the antiglare layer 17 is not particularly limited as long as the antiglare layer 17 is placed on the side of the ultraviolet absorption layer 13 facing away from the colored layer 12 and the transparent substrate 11. The antiglare layer 17 is more preferably located closer to the surface of the optical film 10D. For example, in the example shown in FIG. 1, the antiglare layer 17 is provided to cover the outer side of the ultraviolet absorption layer 13, and is located on the outer surface of the optical film 10D.

The optical film 10D of the present modification is an example in which the ultraviolet absorption layer 13 as an ultraviolet absorption layer, and the antiglare layer 17 are separate layers.

The optical film 10D and the display device 50D of the present modification include the colored layer 12 and the ultraviolet absorption layer 13 as in the first embodiment, and thus have the same effects as in the first embodiment.

In particular, the optical film 10D of the present modification includes the antiglare layer 17, causing external light to be scattered in the antiglare layer 17. This reduces surface reflection and glare of external light, achieving better visibility of the display screen and display light, thus preventing lower display quality due to external light reflection.

Fourth Embodiment

An optical film and a display device according to a fourth embodiment of the present invention will be described.

Figure 5:
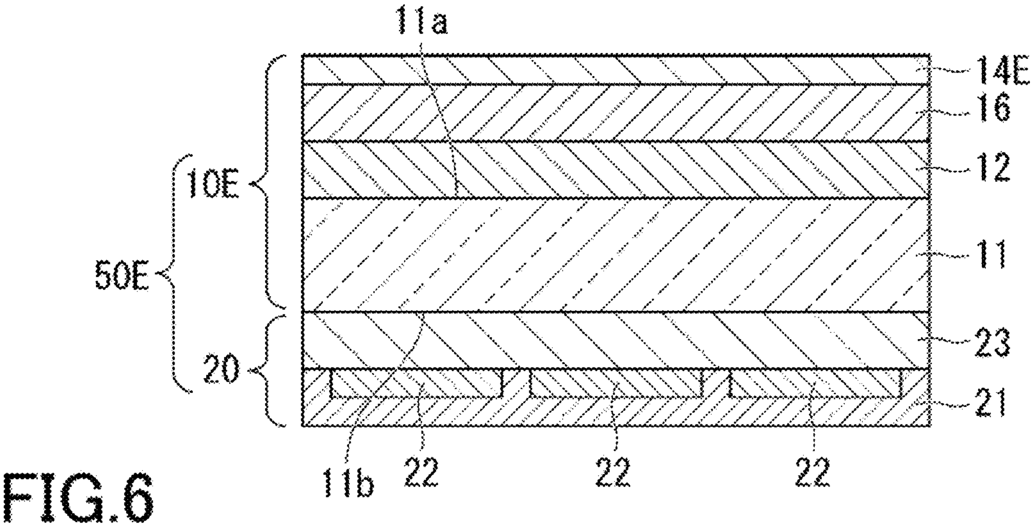
FIG. 5 is a schematic cross-sectional view showing an example of an optical film and a display device according to a fourth embodiment of the present invention.

FIG. 5 is a schematic cross-sectional view showing an example of the optical film and the display device according to the fourth embodiment of the present invention.

A display device 50E of the present embodiment whose cross section in the thickness direction is shown in FIG. 5 includes an optical film 10E of the present embodiment instead of the optical film 10C of the display device 50C of the third embodiment.

The optical film 10E has the same configuration as the optical film 10C except that the optical film 10E includes a low refractive index layer 14E (functional layer) that is laminated on the ultraviolet absorption antiglare layer 16.

The following description will focus on differences from the third embodiment.

The low refractive index layer 14E is the same as the low refractive index layer 14A of the first embodiment except that the low refractive index layer 14E has a lower refractive index than the ultraviolet absorption antiglare layer 16.

Thus, interference occurs between reflected light of external light entering from the outside that is reflected by the interface between the ultraviolet absorption antiglare layer 16 and the low refractive index layer 14E and reflected light reflected by the surface of the low refractive index layer 14E, achieving a lower surface reflectance for external light.

The low refractive index layer 14E can reduce surface reflection of external light, achieving better visibility of the display device 50E.

The material of the low refractive index layer 14E is not particularly limited as long as the material is a transparent material having a lower refractive index than the ultraviolet absorption antiglare layer 16. The material of the low refractive index layer 14E may be the same as that of the low refractive index layer 14A of the first embodiment.

The optical film 10E and the display device 50E of the present embodiment include the colored layer 12 and the ultraviolet absorption antiglare layer 16 as in the third embodiment, and thus have the same effects as in the third embodiment.

In particular, the optical film 10E of the present embodiment includes the low refractive index layer 14E on the outer side, and this reduces surface reflection and glare of external light, achieving better visibility of the display screen and display light, thus preventing lower display quality due to external light reflection.

In the embodiments and modification described above, the light emitting elements are organic EL devices.

However, the light emitting elements are not limited to organic EL devices. The light emitting elements may be, for example, LED devices, inorganic phosphor light emitting elements, or quantum dot light emitting elements. When a light source that emits monochromatic light in the three primary colors R, G, and B is used, the display unit 20 may be configured not to include the color filter module 23.

In the above embodiments and modification, various functional layer configurations are described; however, the functional layer configuration is not limited to these.

For example, in the above description, the ultraviolet absorption layer 13 serves as both an ultraviolet absorption layer and a hard coat layer; however, the optical film may include an ultraviolet absorption layer having a pencil hardness of less than H, and a hard coat layer having a pencil hardness of H or more. In such a case, the hard coat layer is more preferably located closer to the outer side of the optical film than the ultraviolet absorption layer is.

For example, the low refractive index layer or the antiglare layer may also serve as a hard coat layer.

For example, the optical film may further include, as a functional layer, at least one of an antistatic layer that contains an antistatic agent and an antifouling layer that has water repellency. However, the various functional layers described above may also serve as an antistatic layer and an antifouling layer.

EXAMPLES

The optical film according to the present invention will be further described using Examples 1 to 10 and Comparative Examples 1 to 6. The present invention should not be limited in any way by the specific content of the following examples.

In the Examples 1 to 10 and Comparative Examples 1 to 6, optical films 1 to 16 having a layer configuration shown in Table 1 or 2 were prepared. The prepared optical films 1 to 13 were evaluated for the characteristics of the optical films. Furthermore, the optical films 8, 10, and 14 to 16 were used to examine by simulation the characteristics of a display device including an organic EL panel.

TABLE 1

| | Example 1 | Example 2 | Example 3 | Example 4 | Example 5 | Example 6 | Example 7 | Example 8 | Example 9 | Example 10 |
|---|---|---|---|---|---|---|---|---|---|---|
| Optical film | Optical film 1 | Optical film 2 | Optical film 3 | Optical film 4 | Optical film 5 | Optical film 6 | Optical film 7 | Optical film 8 | Optical film 9 | Optical film 10 |
| Functional layer 1 | — | — | Low refractive index layer 1 | Antiglare layer 2 | Low refractive index layer 1 | Low refractive index layer 1 | Low refractive index layer 1 | Low refractive index layer 1 | Low refractive index layer 1 | Low refractive index layer 1 |
| Functional layer 2 | Hard coat layer 1 | Antiglare layer 1 | Hard coat layer 1 | Hard coat layer 1 | Antiglare layer 1 | Hard coat layer 1 | Hard coat layer 1 | Hard coat layer 1 | Hard coat layer 1 | Hard coat layer 1 |
| Functional layer 3 | — | — | — | — | — | — | — | — | Oxygen barrier layer 1 | — |
| Colored layer | Colored layer 1 | Colored layer 1 | Colored layer 1 | Colored layer 1 | Colored layer 1 | Colored layer 2 | Colored layer 3 | Colored layer 4 | Colored layer 1 | Colored layer 5 |
| Transparent substrate | TAC | TAC | TAC | TAC | TAC | TAC | TAC | TAC | TAC | TAC |

TABLE 2

| | Comparative Example 1 | Comparative Example 2 | Comparative Example 3 | Comparative Example 4 | Comparative Example 5 | Comparative Example 6 |
|---|---|---|---|---|---|---|
| Optical film | Optical film 11 | Optical film 12 | Optical film 13 | Optical film 14 | Optical film 15 | Optical film 16 |
| Functional layer 1 | Low refractive index layer 1 | Low refractive index layer 1 | Low refractive index layer 1 | Low refractive index layer 1 | Low refractive index layer 1 | Low refractive index layer 1 |
| Functional layer 2 | Hard coat layer 2 | Hard coat layer 2 | Hard coat layer 3 | Hard coat layer 1 | Hard coat layer 1 | Hard coat layer 2 |
| Functional layer 3 | — | — | — | — | — | — |
| Colored layer | Colored layer 1 | Colored layer 6 | Colored layer 1 | Colored layer 7 | Colored layer 8 | — |
| Transparent substrate | TAC | TAC | TAC | TAC | TAC | TAC |

<Preparation of Optical Films>

The method of forming each layer will be described.

[Formation of Colored Layer]

(Materials Used for Composition for Forming Colored Layer)

The following materials were used as materials for a composition for forming a colored layer to form a colored layer.

The maximum absorption wavelength and half width of colorant materials were calculated as characteristic values of a cured coating film from the spectral transmittance.

First Colorant Material:

Dye-1 Pyrromethene cobalt complex dye represented by the following chemical formula 1 (maximum absorption wavelength: 493 nm; half width: 26 nm)

(Chemical Formula 1)

[Chem. 1]

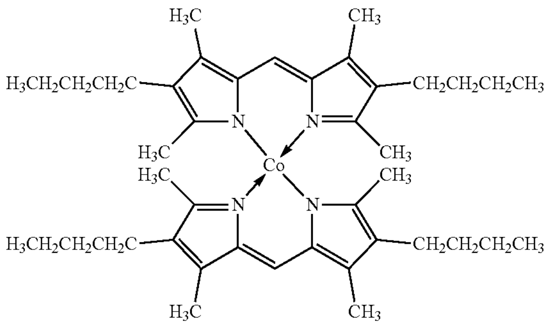

Second Colorant Material:

Dye-2 Tetraazaporphyrin copper complex dye (FDG-007 manufactured by Yamada Kagaku Co., Ltd.; maximum absorption wavelength: 595 nm; half width: 22 nm)

Dye-3 Tetraazaporphyrin copper complex dye (PD-311S manufactured by Yamamoto Chemicals, Inc.; maximum absorption wavelength: 586 nm, half width: 22 nm)

Third Colorant Material:

Dye-4 Phthalocyanine copper complex dye (FDN-002 manufactured by Yamada Kagaku Co., Ltd.; maximum absorption wavelength: 800 nm)

Dye-5 Phthalocyanine cobalt complex dye (FDR-002 manufactured by Yamada Kagaku Co., Ltd.; maximum absorption wavelength: 683 nm)

Additives:

Hindered amine light stabilizer Chimassorb (registered trademark) 944 FDL (manufactured by BASF Japan Ltd.; molecular weight: 2,000 to 3,100)

Hindered amine light stabilizer Tinuvin (registered trademark) 249 (manufactured by BASF Japan Ltd.; molecular weight: 482)

Singlet oxygen quencher D1781 (manufactured by Tokyo Chemical Industry Co., Ltd.) Ultraviolet absorber:

Tinuvin (registered trademark) 479 (manufactured by BASF Japan Ltd.; maximum absorption wavelength: 322 nm)

LA-36 (manufactured by Adeka Corporation; maximum absorption wavelengths: 310 nm, 350 nm) Active energy ray-curable resin:

UA-306H (manufactured by Kyoeisha Chemical Co., Ltd.; pentaerythritol triacrylate hexamethylene diisocyanate urethane prepolymer)

DPHA (dipentaerythritol hexaacrylate)

PETA (pentaerythritol triacrylate)

Initiator: Omnirad (registered trademark) TPO (manufactured by IGM Resins B.V.; absorption wavelength peaks: 275 nm, 379 nm)

Solvent:

MEK (methyl ethyl ketone)

Methyl acetate

The colored layer used in the examples did not contain a dye having a main absorption wavelength range in the wavelength range of 390 to 435 nm.

(Formation of Colored Layer)

As a transparent substrate, a triacetylcellulose film having a thickness of 60 μm was used, and the composition for forming a colored layer shown in Table 3 was applied to a surface of the transparent substrate, and dried in an oven at 80° C. for 60 seconds. Then, the coating film was cured by irradiation with ultraviolet light at an exposure dose of 150 $mJ/cm^2$ using an ultraviolet irradiation device (manufactured by Fusion UV Systems Japan K.K., light source H bulb) to form colored layers 1 to 8 shown in Table 3 so that the colored layers 1 to 8 after curing had a thickness of 5.0 μm. The added amounts shown in Table 3 are expressed as a mass ratio.

TABLE 3

| | | Colored layer 1 | Colored layer 2 | Colored layer 3 | Colored layer 4 | Colored layer 5 | Colored layer 6 | Colored layer 7 | Colored layer 8 |
|---|---|---|---|---|---|---|---|---|---|
| Colorant material | First colorant material | | | | Dye-1 | | | | |
| | Added amount | | | 0.28% | | 0.31% | 0.28% | 0.12% | 0.36% |
| | Second colorant material | | | | Dye-2/Dye-3 | | | Dye-2 | Dye-2/ Dye-3 |
| | Ratio | | | 60/40 | | 88/22 | 60/40 | 100 | 10/90 |
| | Added amount | | | 0.44% | | 0.42% | 0.44% | 0.61% | 0.82% |
| | Third colorant material | | | | Dye-4/Dye-5 | | | | — |
| | Ratio | | | 79/21 | | 75/25 | 79/21 | 87/13 | — |
| | Added amount | | | 1.90% | | 1.86% | 1.90% | 1.73% | — |
| Additive | Type | — | Tinuvin 249 | Chimassorb 944 FDL | Chimassorb 944 FDL/D1781 | Chimassorb 944 FDL/D1781 | — | — | — |
| | Ratio | — | 100 | 100 | 67/33 | 67/33 | — | — | — |
| | Added amount | — | 1.40% | 1.40% | 2.18% | 2.18% | — | — | — |
| Ultraviolet absorber | Type | | — | | — | — | Tinuvin 479/LA36 | — | — |
| | Ratio | | — | | — | — | 40/60 | — | — |
| | Added amount | | — | | — | — | 3.20% | — | — |
| Active energy ray-curable resin | Type | | | | UA-306H/DPHA/PETA | | | | |
| | Ratio | | | | 70/20/10 | | | | |
| | Added amount | 42.85% | 41.44% | 41.44% | 40.66% | 40.69% | 39.64% | 43.00% | 44.28% |
| Photopoly-merization initiator | Type | | | | Omnirad TPO | | | | |
| | Added amount | | | | 4.54% | | | | |
| Solvent | Type | | | | MEK/Methyl acetate | | | | |
| | Ratio | | | | 50/50 | | | | |
| | Added amount | | | | 50.00% | | | | |

[Formation of Functional Layer]

Composition for forming oxygen barrier layer 1:

PVA117 (manufactured by Kuraray Co., Ltd.) 80% aqueous solution (Formation of Oxygen Barrier Layer)

The composition for forming an oxygen barrier layer was applied onto the configuration of Example 9 shown in Table 1 and dried to form an oxygen barrier layer 1 having an oxygen permeability of 1 cc/$m^2$·day·atm.

(Materials Used for Composition for Forming Hard Coat Layer)

The following materials were used as materials for a composition for forming a hard coat layer to form a hard coat layer.

Ultraviolet Absorber:

Tinuvin (registered trademark) 479 (manufactured by BASF Japan Ltd.; maximum absorption wavelength: 322 nm)

LA-36 (manufactured by Adeka Corporation; maximum absorption wavelengths: 310 nm, 350 nm)

Active Energy Ray-Curable Resin:

UA-306H (manufactured by Kyoeisha Chemical Co., Ltd.; pentaerythritol triacrylate hexamethylene diisocyanate urethane prepolymer)

DPHA (dipentaerythritol hexaacrylate)

PETA (pentaerythritol triacrylate)

Initiator:

Omnirad (registered trademark) TPO (manufactured by IGM Resins B.V.; absorption wavelength peaks: 275 nm, 379 nm)

Omnirad (registered trademark) 184 (manufactured by IGM Resins B.V.; absorption wavelength peaks: 243 nm, 331 nm)

Solvent:

MEK (methyl ethyl ketone)

Methyl acetate (Formation of Hard Coat Layer)

The composition for forming a hard coat layer shown in Table 4 was applied onto the colored layer or the transparent substrate shown in Tables 1 and 2, and dried in an oven at 80° C. for 60 seconds. Then, the coating film was cured by irradiation with ultraviolet light at an exposure dose of 150 mJ/$cm^2$ using an ultraviolet irradiation device (manufactured by Fusion UV Systems Japan K.K., light source H bulb) to form hard coat layers 1 to 3 shown in Tables 1 and 2 so that the hard coat layers 1 to 3 after curing had a thickness of 5.0 μm.

TABLE 4

| | | Hard coat layer 1 | Hard coat layer 2 | Hard coat layer 3 |
|---|---|---|---|---|
| UV absorber | Type | Tinuvin 479/LA36 | — | Tinuvin 479/LA36 |
| | Ratio | 40/60 | — | 40/60 |
| | Added amount | 3.2% | — | 3.2% |
| Active energy ray-curable resin | Type | | UA-306H/DPHA/PETA | |
| | Ratio | | 70/20/10 | |
| | Added amount | 42.2% | 45.4% | 42.2% |
| Photopolymerization initiator | Type | Omnirad TPO | | Omnirad 184 |
| | Added amount | | 4.6% | |
| Solvent | Type | | MEK/Methyl acetate | |
| | Ratio | | 50/50 | |
| | Added amount | | 50.0% | |

(Materials Used for Composition for Forming Antiglare Layer)

Ultraviolet Absorber:

Tinuvin (registered trademark) 479 (manufactured by BASF Japan Ltd.; maximum absorption wavelength: 322 nm)

LA-36 (manufactured by Adeka Corporation; maximum absorption wavelengths: 310 nm, 350 nm)

Active Energy Ray-Curable Resin:

Light Acrylate PE-3A (manufactured by Kyoeisha Chemical Co., Ltd.; refractive index: 1.52)

Photopolymerization Initiator:

Omnirad (registered trademark) TPO (manufactured by IGM Resins B.V.;

absorption wavelength peaks: 275 nm, 379 nm)

Resin Particles:

Styrene-methyl methacrylate copolymer particles (refractive index: 1.515; average particle size: 2.0 μm)

Inorganic fine particles 1:

Synthetic smectite

Inorganic fine particles 2:

Alumina nanoparticles, average particle size: 40 nm

Solvent

Toluene

Isopropyl alcohol (Formation of Antiglare Layer)

The composition for forming an antiglare layer shown in Table 5 was applied onto the colored layer or the hard coat layer shown in Table 1, and dried in an oven at 80° C. for 60 seconds. Then, the coating film was cured by irradiation with ultraviolet light at an exposure dose of 150 mJ/cm$^2$ using an ultraviolet irradiation device (manufactured by Fusion UV Systems Japan K.K., light source H bulb) to form antiglare layers 1 and 2 shown in Table 1 so that the antiglare layers 1 and 2 after curing had a thickness of 5.0 μm.

TABLE 5

| | | Antiglare layer 1 | Antiglare layer 2 |
|---|---|---|---|
| UV absorber | Type | Tinuvin 479/ LA36 | — |
| | Ratio | 40/60 | — |
| | Added amount | 3.20% | — |
| Active energy ray-curable resin | Type | PE-3A | PE-3A |
| | Added amount | 40.5% | 43.7% |
| Organic fine particles | Type | Styrene-methyl methacrylate copolymer particles | Styrene-methyl methacrylate copolymer particles |
| | Added amount | 0.5% | 0.5% |
| Inorganic fine particles | Type | Synthetic smectite/Alumina nanoparticles | Synthetic smectite/Alumina nanoparticles |
| | Ratio | 20/80 | 20/80 |
| | Added amount | 1.25% | 1.25% |
| Photopolymerization initiator | Type | Omnirad TPO | Omnirad TPO |
| | Added amount | 4.55% | 4.55% |
| Solvent | Type | Toluene/ Isopropyl alcohol | Toluene/ Isopropyl alcohol |
| | Ratio | 30/70 | 30/70 |
| | Added amount | 50% | 50% |

(Composition for Forming Low Refractive Index Layer 1)

The following materials were used as materials for a composition for forming a low refractive index layer to form a low refractive index layer 1.

Refractive Index Adjusting Agent:

Dispersion of porous silica fine particles (average particle size: 75 nm; solid content: 20%; solvent: methyl isobutyl ketone) 8.5 parts by mass Antifouling Agent:

OPTOOL (registered trademark) AR-110 (manufactured by Daikin Industries, Ltd.; solid content: 15%; solvent: methyl isobutyl ketone) 5.6 parts by mass Active Energy Ray-Curable Resin:

Pentaerythritol triacrylate 0.4 parts by mass

Initiator:

Omnirad (registered trademark) 184 (manufactured by IGM Resins B.V.) 0.07 parts by mass Leveling Agent:

RS-77 (manufactured by DIC Corporation) 1.7 parts by mass

Solvent:

Methyl isobutyl ketone 83.73 parts by mass (Formation of Low Refractive Index Layer 1)

The composition for forming a low refractive index layer, having the above composition, was applied onto the hard coat layer or the antiglare layer shown in Tables 1 and 2, and dried in an oven at 80° C. for 60 seconds. Then, the coating film was cured by irradiation with ultraviolet light at an exposure dose of 200 mJ/cm$^2$ using an ultraviolet irradiation device (manufactured by Fusion UV Systems Japan K.K., light source H bulb) to form the low refractive index layer 1 shown in Tables 1 and 2 so that the low refractive index layer 1 after curing had a thickness of 100 nm.

[Evaluation of Characteristics of Films]

The obtained optical films 1 to 13 were evaluated for the following items.

(Ultraviolet Shielding Rate)

The ultraviolet absorption layer formed on the colored layer of the obtained optical films was peeled off from the colored layer using a cellophane tape in accordance with the JIS-K 5600 adhesion test. The transmittance of the ultraviolet absorption layer as a single layer was measured by using an automatic spectrophotometer (U-4100 manufactured by Hitachi, Ltd.) using an adhesive tape as a reference. Then, the average transmittance [%] in the ultraviolet region (290 nm to 400 nm) was calculated, and the ultraviolet shielding rate [%] was calculated as a value obtained by subtracting the average transmittance [%] in the ultraviolet region (290 nm to 400 nm) from 100%.

(Pencil Hardness Test)

The surface of the optical films was subjected to a test using a pencil (Uni manufactured by Mitsubishi Pencil Co., Ltd.; pencil hardness: H) at a load of 500 gf (4.9 N) (hereinafter, a load of 500 g) in accordance with JIS-K5600-5-4: 1999 by using a Clemens-type scratch hardness tester (HA-301 manufactured by Tester Sangyo Co., Ltd.), and the optical films were evaluated by visual observation for a change in appearance due to scratches. The optical films on which no scratches were observed were determined to be good ("Good" in Tables 6 and 7), and the optical film on which scratching was observed was determined to be poor ("Poor" in Table 7).

(Light Resistance Test)

The obtained optical films including the colored layer were subjected to a reliability test using a xenon weather meter (X75 manufactured by Suga Test Instruments Co., Ltd.) at a xenon lamp illuminance of 60 W/cm$^2$ (300 nm to 400 nm) at a temperature of 45° C. and a humidity of 50% RH in the tester for 120 hours, and before and after the test, the transmittance of the optical films was measured using an automatic spectrophotometer (U-4100 manufactured by Hitachi, Ltd.). Then, a transmittance difference $\Delta T\lambda 1$ between before and after the test at a wavelength $\lambda 1$ at which the minimum transmittance before the test was in the wavelength range of 470 nm to 530 nm, a transmittance difference $\Delta T\lambda 2$ between before and after the test at a wavelength $\lambda 2$ at which the minimum transmittance before the test was in the wavelength range of 560 nm to 620 nm, and a transmittance difference $\Delta T\lambda 3$ between before and after the test at a wavelength at which the minimum transmittance before the test was in the wavelength range of 650 nm to 780 nm were calculated. An optical film having a transmittance difference closer to zero is better. An optical film in which |ΔTλN|≤20 (N=1 to 3) is preferable, and an optical film in which |ΔTλN|≤10 (N=1 to 3) is more preferable.

The results of the evaluation for the above items are shown in Tables 6 and 7.

TABLE 6

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Ultraviolet absorption layer | | Hard coat layer 1 | Antiglare layer 1 | Hard coat layer 1 | Hard coat layer 1 | Antiglare layer 1 | Hard coat layer 1 | Hard coat layer 1 | Hard coat layer 1 | Hard coat layer 1 | Hard coat layer 1 |
| Ultraviolet shielding rate of layer above colored layer | | 90.4% | 90.4% | 90.5% | 90.4% | 90.5% | 90.5% | 90.5% | 90.5% | 90.5% | 90.5% |
| Pencil hardness | | Good | Good | Good | Good | Good | Good | Good | Good | Good | Good |
| Light resistance | ΔTλ1 | 19.5 | 19.2 | 19.8 | 19.0 | 19.2 | 19.4 | 8.4 | 6.5 | 6.4 | 7.0 |
| | ΔTλ2 | 8.0 | 8.1 | 8.0 | 8.3 | 8.0 | 7.6 | 6.2 | 2.5 | 3.5 | 3.0 |
| | ΔTλ3 | 13.4 | 13.2 | 13.2 | 13.0 | 13.5 | 11.2 | 6.4 | 4.5 | 2.8 | 5.1 |

TABLE 7

| | | Comparative Example 1 | Comparative Example 2 | Comparative Example 3 |
|---|---|---|---|---|
| Ultraviolet absorption layer | | — | Colored layer 6 | Hard coat layer 3 |
| Ultraviolet shielding rate of layer above colored layer | | 7.2% | 7.2% | 90.5% |
| Pencil hardness | | Good | Good | Poor |
| Light resistance | ΔTλ1 | 41.4 | 46.0 | 27.6 |
| | ΔTλ2 | 49.1 | 25.0 | 22.0 |
| | ΔTλ3 | 19.5 | 8.2 | 13.0 |

As shown in Tables 6 and 7, in the optical films in which the ultraviolet absorption layer having an ultraviolet shielding rate of 85% or more was provided above the colored layer containing the first to third colorant materials, the colored layer had significantly higher light resistance. The use of a colored layer having ultraviolet absorptivity was less effective, and it was preferable to provide a layer having ultraviolet absorptivity as a separate layer located above the colored layer. In the optical film in which the oxygen barrier layer was laminated on the colored layer and the optical films in which the colored layer contained a hindered amine light stabilizer having a high molecular weight as a radical scavenger and a dialkyl dithiocarbamate nickel complex as a singlet oxygen quencher, the colored layer had even higher light resistance. Furthermore, the optical films in which the ultraviolet absorption layer contained a photopolymerization initiator and an ultraviolet absorber having different absorption wavelength ranges achieved both ultraviolet absorptivity and hardness.

[Evaluation of Characteristics of Display Devices]

The obtained optical films 8, 10, and 14 to 16 were evaluated for the following items.

(White Display Transmission Characteristic)

Figure 6:
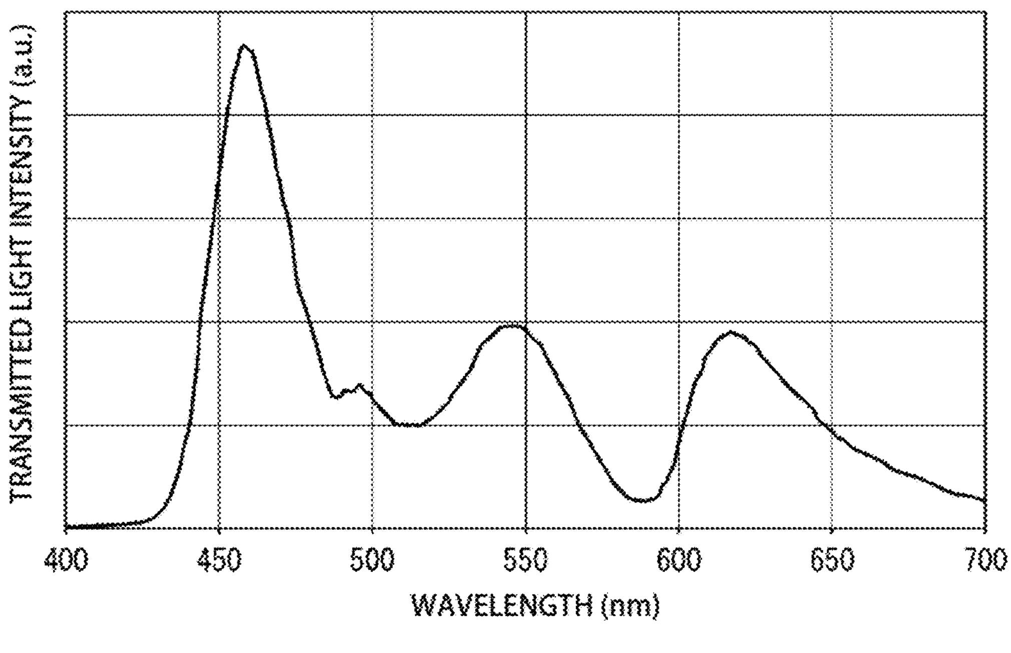
FIG. 6 is a graph showing a spectrum of light during white display output through an organic EL light source and a color filter in examples.

The transmittance of the obtained optical films was measured using an automatic spectrophotometer (U-4100 manufactured by Hitachi, Ltd.). The transmittance was used to calculate the efficiency of light transmitted through the optical films during white display, and the efficiency was evaluated as a white display transmission characteristic. The efficiency was calculated as a ratio of the light intensity at each wavelength of light transmitted through the optical films to the light intensity at each wavelength during white display in which light was emitted from a white organic EL light source (hereinafter may be referred to as an organic EL light source) and output through the color filter. A higher light intensity ratio indicates a higher luminous efficacy of the light source. FIG. 6 shows a spectrum of light emitted from the EL light source. In FIG. 6, the horizontal axis indicates the wavelength (nm), and the vertical axis indicates the transmitted light intensity (a.u.).

(Display Device Reflection Characteristic 1)

The transmittance T (λ) and the surface reflectance R2 (λ) of the obtained optical films were measured using an automatic spectrophotometer (U-4100 manufactured by Hitachi, Ltd.). In the measurement of the surface reflectance R2 (λ), the optical films were subjected to antireflection treatment by applying a matte black coating material to the surface of the triacetylcellulose film which is the transparent substrate, on which neither the colored layer nor the functional layer was provided, and the spectral reflectance at an incident angle of 5° of the optical films was measured to obtain the surface reflectance R2 (λ). A relative reflection value relative to the intensity of reflected light from illuminant D65 when no optical film was provided was calculated, without considering interfacial reflection between the layers or surface reflection, based on formulas (4), (5), (7), and (9), where the electrode reflectance $R_E$ (λ) was 100% at all wavelengths in the wavelength range of 380 nm to 780 nm, and the relative reflection value was evaluated as a display device reflection characteristic 1. A lower relative reflection value indicates a lower intensity of reflected light and higher display quality.

(Display Device Reflection Hue 1)

The transmittance T (λ) and the surface reflectance R2 (λ) of the obtained optical films were measured using an automatic spectrophotometer (model number: U-4100 manufactured by Hitachi, Ltd.). In the measurement of the surface reflectance R2 (λ), the optical films were subjected to antireflection treatment by applying a matte black coating material to the surface of the triacetylcellulose film which is the transparent substrate, on which neither the colored layer nor the functional layer was provided, and the spectral reflectance at an incident angle of 5° of the optical films was measured to obtain the surface reflectance R2 (λ). The chromaticness indexes (values) a* and b* of the reflection hue for illuminant D65 were calculated, without considering interfacial reflection between the layers or surface reflection, based on formulas (1) to (9), where the electrode reflectance $R_E$ (λ) was 100% at all wavelengths in the wavelength range of 380 nm to 780 nm, and the values a* and b* were evaluated as a display device reflection hue 1.

Values a* and b* closer to zero indicate better values with less color. The values a* and b* are preferably from −5 to +5 inclusive.

(Display Device Reflection Characteristic 2)

Figure 8:
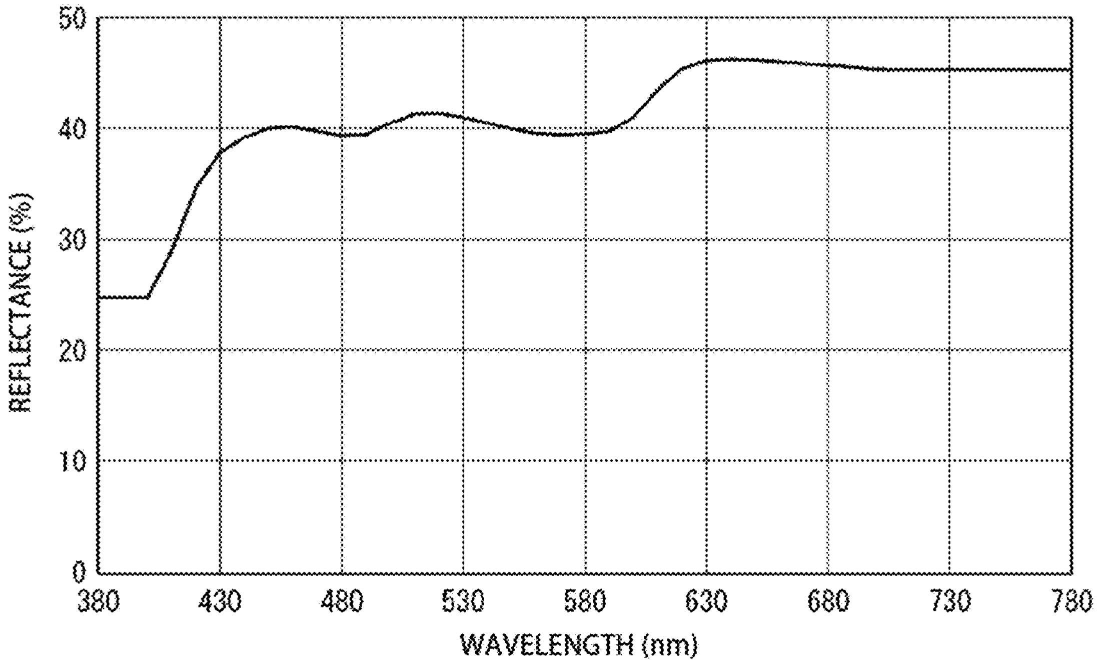
FIG. 8 is a graph showing the electrode reflectance of an organic EL display device for which a display device reflection characteristic 2 and a display device reflection hue 2 are calculated in the examples.

A relative reflection value was obtained in the same manner as the display device reflection characteristic 1 except that the electrode reflectance $R_E$ (λ) was an electrode reflectance obtained by reflectance measurement using an organic light emitting display device (organic EL TV OLED55C8PJA manufactured by LG Electronics) shown in FIG. 8, and the relative reflection value was evaluated as a display device reflection characteristic 2. As with the display device reflection characteristic 1, a lower relative reflection value indicates a lower intensity of reflected light and higher display quality. In FIG. 8, the horizontal axis indicates the wavelength (nm), and the vertical axis indicates the reflectance (%).

(Display Device Reflection Hue 2)

The chromaticness indexes (values) a* and b* of the reflection hue for illuminant D65 were obtained in the same manner as the display device reflection hue 1 except that the electrode reflectance $R_E$ (λ) was an electrode reflectance obtained by reflectance measurement using an organic light emitting display device (organic EL TV OLED55C8PJA manufactured by LG Electronics) shown in FIG. 8, and the values a* and b* were evaluated as a display device reflection hue 2. As with the display device reflection hue 1, values a* and b* closer to zero indicate better values with less color. The values a* and b* are preferably from −5 to +5 inclusive.

(Color Reproducibility)

Figure 7:
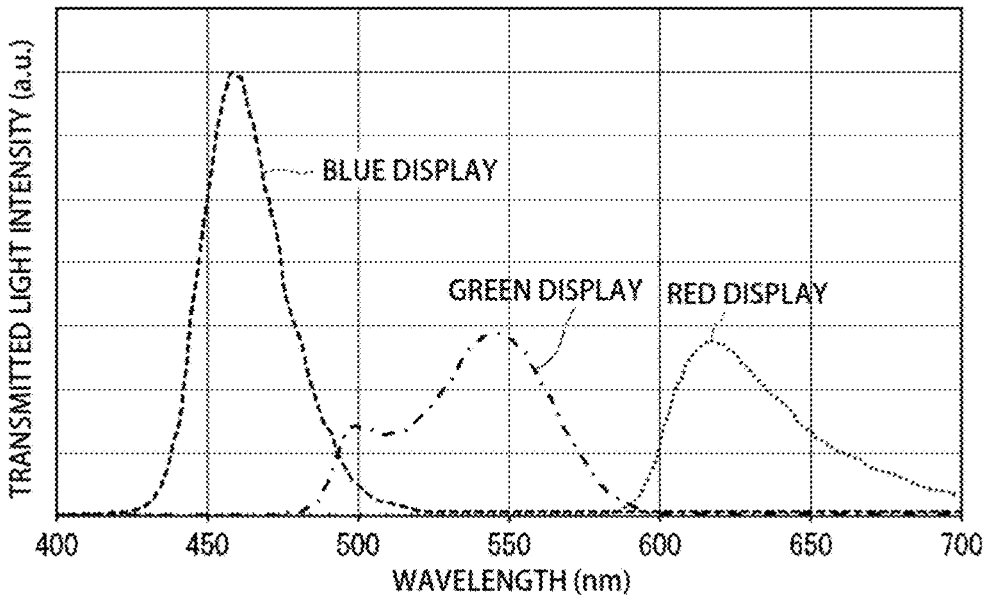
FIG. 7 is a graph showing a spectrum of light during each of red display, green display, and blue display output through the organic EL light source and the color filter in the examples.

The transmittance of the obtained optical films was measured using an automatic spectrophotometer (U-4100 manufactured by Hitachi, Ltd.). A CIE 1931 chromaticity value was calculated using the transmittance and a spectrum of light for each of red display, green display, and blue display as shown in FIG. 7 output through the organic EL light source for which the overall spectrum is shown in FIG. 6 and the color filter. Then, an NTSC ratio was calculated from the CIE 1931 chromaticity value, and evaluated for color reproducibility.

A higher NTSC ratio indicates higher color reproducibility and is more preferable. In FIG. 7, the horizontal axis indicates the wavelength (nm), and the vertical axis indicates the transmitted light intensity (a.u.).

The results of the evaluation for the above items are shown in Table 8.

TABLE 8

| | | Example 8 | Example 10 | Comparative Example 4 | Comparative Example 5 | Comparative Example 6 |
|---|---|---|---|---|---|---|
| White display | | 51.9 | 51.8 | 52.6 | 50.1 | 91.4 |
| transmission characteristic | % relative to Comparative Example 6 | 57% | 57% | 58% | 55% | 100% |
| Display device | | 25.8 | 25.7 | 25.8 | 25.8 | 83.7 |
| reflection characteristic 1 | % relative to Comparative Example 6 | 31% | 31% | 31% | 31% | 100% |
| Display device | a* | 4.5 | 2.5 | 11.0 | 12.0 | −0.2 |
| reflection hue 1 | b* | −4.8 | −3.0 | −21.3 | −10.0 | 0.9 |
| Display device | | 11.2 | 11.2 | 11.2 | 11.3 | 34.8 |
| reflection characteristic 2 | % relative to Comparative Example 6 | 32% | 32% | 32% | 32% | 100% |
| Display device | a* | 4.4 | 3.0 | 9.0 | 10.5 | 1.4 |
| reflection hue 2 | b* | −1.7 | −0.4 | −13.4 | −4.9 | 2.7 |
| Color reproducibility | NTSC ratio | 97.0% | 96.8% | 98.3% | 101.8% | 91.7% |

As shown in Table 8, the display devices including the colored layer had a significantly low reflection characteristic. Although a circular polarizing plate was considered to reduce the transmittance by half, as shown in the evaluation values of the white display transmission characteristic, the display devices including the colored layer had high luminous efficacy and high color reproducibility. Furthermore, in the colored layer containing the first, second, and third colorant materials in the examples, the absorption intensity of the colorant materials was adjustable so that each of the chromaticness indexes a* and b* of the reflection hue was in the range from −5 to +5 inclusive, where the electrode reflectance $R_E$ (λ) was 100% at all wavelengths in the wavelength range of 380 nm to 780 nm. That is, a reflection hue close to neutral was achieved. Furthermore, the results showed that a neutral reflection hue was also maintained in the display device reflection hue 2 obtained using the electrode reflectance of an actual organic light emitting display device, and higher display quality of the display device was confirmed. As described above, it is also an aspect of the present invention to adjust the combination ratio of first, second, and third colorant materials to cause a reflection hue of an optical film including a colored layer to be neutral for the electrode reflectance of an organic light emitting display device having various wavelength dispersion properties.

The preferred embodiments and modification of the present invention have been described by way of examples; however, the present invention is not limited to the embodiments or the examples. Additions, omissions, substitutions, and other changes in the configuration are possible without departing from the spirit of the present invention.

Furthermore, the present invention should not be limited by the foregoing description, but should be limited only by the appended claims.

INDUSTRIAL APPLICABILITY

The present invention provides an optical film and a display device achieving higher display quality by reducing external light reflection and a longer life of a light emitting element of the display device.

REFERENCE SIGNS LIST

10A, 10B, 10C, 10D, 10E Optical film; 11 Transparent substrate; 11*a* First surface; 11*b* Second surface; 12 Colored layer; 13 Ultraviolet absorption layer (functional layer); 14A, 14E Low refractive index layer (functional layer); 15 Oxygen barrier layer (functional layer); 16 Ultraviolet absorption antiglare layer (ultraviolet absorption layer, functional layer, antiglare layer); 17 Antiglare layer (functional layer); 20 Display unit; 21 Substrate; 22 Light emitting element; 22R First light emitting element; 22G Second light emitting element; 22B Third light emitting element; 23 Color filter module 50A, 50B, 50C, 50D, 50E Display device.

What is claimed is:

1. An optical film, comprising:

a transparent substrate;

a colored layer comprising one or more layers that contain a colorant, the colored layer being arranged to overlap with the transparent substrate; and one or more functional layers arranged to face a surface of the colored layer opposite to that facing the transparent substrate, wherein the colored layer contains a first colorant material in which a maximum absorption wavelength is in a range of 470 nm or more and 530 nm or less and a half width of an absorption spectrum thereof is 15 nm or more and 45 nm or less, a second colorant material in which a maximum absorption wavelength is in a range of 560 nm or more and 620 nm or less and a half width of an absorption spectrum thereof is 15 nm or more and 55 nm or less, and a third colorant material in which in a wavelength range of 400 nm to 780 nm, a wavelength at which a transmittance is lowest is in a range of 650 nm or more and 780 nm or less, the one or more functional layers include an ultraviolet absorption layer that has an ultraviolet shielding rate of 85% or more, a surface of the optical film has a pencil hardness of H or more at a load of 500 g, and each of values a* and b* of a hue of the optical film that are defined by the following formulas (1) to (9) is in a range from −5 to +5 inclusive:

[Math. 1]

$$a^* = 500\left\{f\left(\frac{X}{X_n}\right) - f\left(\frac{Y}{Y_n}\right)\right\} \quad (1)$$

[Math. 2]

$$b^* = 200\left\{f\left(\frac{Y}{Y_n}\right) - f\left(\frac{Z}{Z_n}\right)\right\} \quad (2)$$

[Math. 3]

$$f(t) = \begin{cases} t^{\frac{1}{3}}\left[t \le \left(\frac{6}{29}\right)^3\right] \\ \frac{1}{3}\left(\frac{29}{6}\right)^2 t + \frac{4}{29}\left[t \le \left(\frac{6}{29}\right)^3\right] \end{cases} \quad (3)$$

[Math. 4]

$$R1(\lambda)[\%] = \frac{(100 - R2(\lambda))}{100} \times \frac{T(\lambda)}{100} \times \frac{T(\lambda)}{100} \times R_E(\lambda) \quad (4)$$

[Math. 5]

$$R(\lambda)[\%] = R1(\lambda) + R2(\lambda) \quad (5)$$

[Math. 6]

$$X = k \times \int_{380}^{780} P_{D65}(\lambda) \times R(\lambda) \times \bar{x}(\lambda) d\lambda \quad (6)$$

[Math. 7]

$$Y = k \times \int_{380}^{780} P_{D65}(\lambda) \times R(\lambda) \times \bar{y}(\lambda) d\lambda \quad (7)$$

[Math. 8]

$$Z = k \times \int_{380}^{780} P_{D65}(\lambda) \times R(\lambda) \times \bar{z}(\lambda) d\lambda \quad (8)$$

[Math. 9]

$$k = 100 / \int_{380}^{780} P_{D65}(\lambda) \times \bar{y}(\lambda) d\lambda \quad (9)$$

where λ is a variable representing a wavelength, and t is a variable representing a ratio of X, Y, and Z to $X_n$, $Y_n$, and $Z_n$, respectively, the values a* and b* calculated from the formulas (1) to (3) are calculated according to a calculation method for a CIE 1976 L*a*b*color space, which is a CIELAB color space, in the formulas (1) and (2), $X_n$, $Y_n$, and $Z_n$ are tristimulus values at a white point of illuminant D65, in the formula (4), $R_E$ (λ) is a function representing a reflectance [%] of a perfect reflecting diffuser, which is 100% at each wavelength, R2 (λ) is a function representing a surface reflectance [%] of an outermost surface of the optical film facing away from the transparent substrate, and T (λ) is a function representing a transmittance [%] of the optical film, in the formula (6) to (9), $P_{D65}$ (λ) is an illuminant D65 spectrum, and $\bar{x}$ (λ), $\bar{y}$ (λ), and $\bar{z}$ (λ) are CIE 1931 2° color-matching functions, and each definite integral in the formulas (6) to (9) is obtained by appropriate numerical integration, and the numerical integration is performed at a wavelength interval of 1 nm, wherein each of the first colorant, the second colorant and the third colorant is selected from the group consisting of a compound having a porphyrin structure, a compound having a pyrromethene structure, a compound having a phthalocyanine structure, and a compound having a squarylium structure, and wherein the first colorant, the second colorant and the third colorant are the only colorants in the colored layer.

2. The optical film of claim 1, wherein the colored layer does not contain a dye having a main absorption wavelength range in a wavelength range of 390 to 435 nm.

3. The optical film of claim 1, wherein the ultraviolet absorption layer comprises a cured film of a composition containing an energy ray-curable compound, a photopolymerization initiator, and an ultraviolet absorber, an absorption wavelength range in an ultraviolet region of the photopolymerization initiator is different from an absorption wavelength range in the ultraviolet region of the ultraviolet absorber, and an absorption wavelength range in the ultraviolet region of the ultraviolet absorption layer is a range of 290 nm or more and 370 nm or less.

4. The optical film of claim 1, wherein the one or more functional layers include a low refractive index layer that has a lower refractive index than the ultraviolet absorption layer, and the low refractive index layer is laminated on a surface of the ultraviolet absorption layer opposite to that facing the colored layer.

5. The optical film of claim 1, wherein the one or more functional layers further include an antiglare layer, and the ultraviolet absorption layer and the antiglare layer are provided in this order in a direction from the transparent substrate toward the colored layer.

6. The optical film of claim 1, wherein the ultraviolet absorption layer is an antiglare layer that contains an ultraviolet absorber.

7. The optical film of claim 1, wherein the one or more functional layers further include at least one of an antistatic layer that contains an antistatic agent and an antifouling layer that has water repellency.

8. The optical film of claim 1, wherein the colored layer contains at least one of a radical scavenger, a peroxide decomposer, and a singlet oxygen quencher.

9. The optical film of claim 8, wherein the colored layer contains, as the radical scavenger, a hindered amine light stabilizer having a molecular weight of 2,000 or more.

10. The optical film of claim 8, wherein the colored layer contains, as the singlet oxygen quencher, any of a dialkyl phosphate, dialkyl dithiocarbamate, benzenedithiol, and transition metal complexes thereof.

11. The optical film of claim 1, wherein the one or more functional layers include a layer that has an oxygen permeability of 10 $cc/m^2 \cdot day \cdot atm$ or less.

12. A display device, comprising:

a light source; and the optical film according to claim 1.

13. The display device of claim 12, wherein the light source includes a plurality of light emitting elements that emit light based on an image signal.

* * * * *